(12) United States Patent
Hirano et al.

(10) Patent No.: US 8,777,553 B2
(45) Date of Patent: Jul. 15, 2014

(54) SEMICONDUCTOR MANUFACTURING APPARATUS AND SEMICONDUCTOR DEVICE MANUFACTURING METHOD

(75) Inventors: Makoto Hirano, Toyama (JP); Akinari Hayashi, Toyama (JP); Makoto Tsuri, Toyama (JP); Haruyuki Miyata, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 73 days.

(21) Appl. No.: 13/533,053

(22) Filed: Jun. 26, 2012

(65) Prior Publication Data

US 2012/0289058 A1 Nov. 15, 2012

Related U.S. Application Data

(63) Continuation of application No. 11/662,584, filed as application No. PCT/JP2005/017018 on Sep. 15, 2005, now abandoned.

(30) Foreign Application Priority Data

Sep. 15, 2004 (JP) .................................. 2004-268369
Sep. 24, 2004 (JP) .................................. 2004-276671

(51) Int. Cl.
*B65H 1/00* (2006.01)
(52) U.S. Cl.
USPC ........................................................ 414/805
(58) Field of Classification Search
USPC .................... 414/217, 221, 805, 935, 937; 156/345.31
See application file for complete search history.

(56) References Cited

U.S. PATENT DOCUMENTS

| | | | | | |
|---|---|---|---|---|---|
| 5,273,423 A | * | 12/1993 | Shiraiwa | ......................... | 432/241 |
| 5,277,579 A | * | 1/1994 | Takanabe | ........................... | 432/5 |
| 5,303,671 A | * | 4/1994 | Kondo et al. | ................. | 118/719 |
| 5,378,283 A | * | 1/1995 | Ushikawa | ..................... | 118/719 |
| 5,388,944 A | * | 2/1995 | Takanabe et al. | ............. | 414/217 |
| 6,044,874 A | * | 4/2000 | Saga | ............................. | 141/63 |
| 6,158,946 A | * | 12/2000 | Miyashita | ..................... | 414/411 |

(Continued)

FOREIGN PATENT DOCUMENTS

| | | |
|---|---|---|
| JP | 2003-007801 | 1/2003 |
| JP | 2003-045931 | 2/2003 |

OTHER PUBLICATIONS

Notice of Reasons for Rejection received from the Japanese Patent Office in counterpart application No. 2006-535193 dated Jan. 26, 2010 with English translation (7 pages).

*Primary Examiner* — Saul Rodriguez
*Assistant Examiner* — Glenn Myers
(74) *Attorney, Agent, or Firm* — Kratz, Quintos & Hanson, LLP

(57) ABSTRACT

Adverse effects when a carrier is open, such as particles adhesion to the substrate or natural oxidation film deposits on the substrate, as well as a rise in oxygen concentration and contamination of the substrate transfer chamber are prevented. Semiconductor manufacturing apparatus includes a carrier in which a cover unit is provided on a substrate loading/unloading opening for loading and unloading a substrate, a carrier open/close chamber continuously arranged to the carrier, a substrate transfer chamber continuously arranged to the carrier open/close chamber, a substrate processing chamber continuously arranged to the substrate transfer chamber, an exhaust means for exhausting the atmosphere in the carrier open/close chamber by suction, and an exhaust quantity adjuster means for adjusting the suction exhaust quantity of the exhaust means.

9 Claims, 13 Drawing Sheets

(56) References Cited

U.S. PATENT DOCUMENTS

| | | | |
|---|---|---|---|
| 6,186,331 B1 | 2/2001 | Kinpara et al. | 206/711 |
| 6,347,990 B1 * | 2/2002 | Sung et al. | 454/187 |
| 6,390,754 B2 * | 5/2002 | Yamaga et al. | 414/217 |
| 6,816,251 B2 * | 11/2004 | Swan et al. | 356/237.4 |
| 6,817,822 B2 * | 11/2004 | Tokunaga | 414/217 |
| 7,077,173 B2 * | 7/2006 | Tokunaga | 141/66 |

* cited by examiner

SEMICONDUCTOR MANUFACTURING APPARATUS AND SEMICONDUCTOR DEVICE MANUFACTURING METHOD

RELATED APPLICATIONS

This application is a continuation of U.S. patent application Ser. No. 11/662,584 field Nov. 29, 2007 now abandoned, which application claims priority of Japanese Application No. 2004-268369 filed Sep. 15, 2004 and Japanese Application No. 2004-276671 filed Sep. 24, 2004, the entire contents of which are incorporated herein by reference.

TECHNICAL FIELD

The present invention relates to a semiconductor manufacturing apparatus and a semiconductor device manufacturing method, and relates in particular to technology for opening and closing a carrier with a cover unit, and is effective for use in a batch type vertical diffusion CVD apparatus for forming CVD films such as insulation films, metallic films and semiconductor films or diffusing dopants on semiconductor wafers (hereafter called wafers) to form semiconductor integrated circuits including semiconductor devices in methods for example for manufacturing semiconductor integrated circuit devices (hereafter called IC.).

BACKGROUND ART

Batch type vertical diffusion CVD apparatus (hereafter called batch type CVD apparatus) are one type of semiconductor manufacturing apparatus widely used in IC manufacturing methods in processes for forming CVD films such as insulation films, metallic films and semiconductor films and diffusing dopants on the wafer. In the batch type CVD apparatus, multiple wafers are handled while stored inside a carrier (wafer transfer container).

Carriers of this type in the prior art are an open cassette formed in a three-dimensional box shape opened on two opposing sides; and a FOUP (front opening unified pod, hereafter called pod) where an opening/closing cover unit is mounted on the open side of a container formed in a three-dimensional box shape with one open side.

When a pod is utilized as the wafer carrier, the wafers are transported in a sealed state so that the purity of the wafers can be maintained even when there are particles in the surrounding atmosphere.

There is therefore no need to set the clean room where the batch type CVD apparatus is installed to a very high degree of purity and therefore the cost of maintaining the clean room can be reduced.

Pods are therefore utilized in recent years as wafer carriers in batch type CVD apparatus.

In batch type CVD apparatus where pods are utilized as wafer carriers, the pod open/close device (hereafter pod opener) to open and close the wafer loading/unloading opening of the pod with the mountable/removable cover unit, is installed on a wafer transfer port for loading and unloading the wafers in the pod.

Pod openers of this type in the prior art included a mount stand for holding the pod, and a closure for holding the cover unit of the pod held on the mount stand. The closure moved forwards or backwards relative to the pod while holding the cover unit to place or remove the cover unit on the wafer loading/unloading opening. An example of this technology is disclosed in the patent document 1.

Patent document 1: Japanese Patent Non-examined publication No. 2003-7801

DISCLOSURE OF INVENTION

Problems to be Solved by the Invention

Batch type CVD apparatus of the prior art sometimes filled the wafer storage chamber of the pod with inert gas. However, leaks occurred in the sealed sections so that the wafer storage chamber of the pod became the same as the air atmosphere.

When the pod was opened while the wafer storage chamber became the air atmosphere in this way, the problem occurred that the air in the wafer storage chamber of the pod penetrated into the inner space of the wafer transfer port in the batch type CVD apparatus, and contaminated the inner space and raised the oxygen concentration.

Moreover, when the pod in the batch type CVD apparatus of the prior art was opened by the pod opener; the wafer storage chamber of the pod was exposed to the air atmosphere so that a natural oxidation film was deposited and particles adhered to the wafers stored in the wafer storage chamber.

The wafer storage chamber of the pod was therefore sometimes filled with inert gas.

However, the wafer storage chamber of the pod in most cases became the air atmosphere so that when the pod was opened, the air inside the wafer storage chamber of the pod penetrated into the wafer transfer chamber as the space on the inner side of the wafer transfer port in the batch type CVD apparatus, so that the wafer transfer chamber became contaminated and the oxygen concentration increased.

The present invention therefore has the object of providing a semiconductor manufacturing apparatus and semiconductor device manufacturing method capable of preventing adverse effects when the pod is open, such as particles adhesion to the substrate or natural oxidation film deposits on the substrate, as well as a rise in oxygen concentration and contamination of the inner space.

Means to Solve the Problems

Typical means for resolving the above problems are described next.

(1) A semiconductor manufacturing apparatus comprising a carrier in which a freely mountable/removable cover unit is provided on a substrate loading/unloading opening and a substrate is stored into a substrate storage chamber through the substrate loading/unloading opening, and a carrier open/close chamber continuously arranged to the carrier, and a substrate transfer chamber continuously arranged to the carrier open/close chamber, and a substrate processing chamber continuously arranged to the substrate transfer chamber, and an exhaust means for exhausting the atmosphere within the carrier open/close chamber by suction, and an exhaust quantity adjuster means for regulating the suction exhaust quantity of the exhaust means.

(2) A semiconductor manufacturing apparatus according to the previous first aspect (1) comprising an inert gas supply means for supplying inert gas to the carrier open/close chamber and, a controller for regulating the exhaust quantity of the exhaust quantity adjuster means so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber, when supplying inert gas from the inert gas supply means to the carrier open/close chamber.

(3) A semiconductor manufacturing apparatus according to the previous first aspect (1) comprising an inert gas supply means for supplying inert gas to the carrier open/close chamber and, a controller for regulating the exhaust quantity adjuster means so that when supplying inert gas from the inert gas supply means to the carrier open/close chamber, the quantity of exhaust from the inert gas supply means becomes larger than the quantity of exhaust when inert gas is not being supplied.

(4) A semiconductor manufacturing apparatus according to the previous first aspect (1) comprising an inert gas supply means for supplying inert gas to the carrier open/close chamber and, a controller for regulating the exhaust quantity of the exhaust quantity adjuster means so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber, when the opening of the substrate transfer chamber connecting the carrier open/close chamber is closed.

(5) A semiconductor manufacturing apparatus according to any one of aspects (1) to (4), wherein the exhaust quantity of the exhaust quantity adjuster means is regulated so that the atmosphere within the apparatus flows from the transfer chamber to the carrier open/close chamber, and further from the carrier open/close chamber to outside the apparatus.

(6) A semiconductor manufacturing apparatus according to the previous first aspect (1) comprising a controller for regulating the exhaust quantity of the exhaust quantity adjuster means so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber when the substrate loading/unloading opening of the carrier with removable cover unit is open, and the opening of the substrate transfer chamber connecting the carrier open/close chamber is closed.

(7) A semiconductor manufacturing apparatus according to the previous first aspect (1) comprising a controller for regulating the exhaust quantity of the exhaust quantity adjuster means so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber when the substrate loading/unloading opening of the carrier with removable cover unit is opened, the cover unit is retracted into a cover unit retraction chamber formed in the carrier open/close chamber, a substrate transfer space is formed to allow passage of the substrate between the carrier open/close chamber and the substrate transfer chamber, wherein the exhaust means is arranged in a position to allow gas flow from the substrate transfer space via the cover unit retraction chamber to the exhaust means.

(8) A semiconductor manufacturing apparatus according to the previous first aspect (1), wherein the exhaust quantity of the exhaust quantity adjuster means is regulated so that the atmosphere within the apparatus flows from the transfer chamber to the carrier open/close chamber, and further from the carrier open/close chamber to outside the apparatus when the substrate loading/unloading opening of the carrier with removable cover unit is open, the cover unit is retracted into a cover unit retraction chamber formed in the carrier open/close chamber, and a substrate transfer space is formed to allow passage of the substrate between the carrier open/close chamber and the substrate transfer chamber; and moreover the exhaust means is arranged in a position to allow gas flow from the substrate transfer space via the cover unit retraction chamber to the exhaust means.

(9) A semiconductor manufacturing apparatus according to the previous first aspect (1), wherein the carrier open/close chamber has a cover unit retraction chamber to allow retraction of the cover unit released by the carrier open/close device and a substrate transfer space formed to connect the carrier and the carrier open/close chamber and the substrate transfer chamber to allow passage of the substrate, the exhaust means is arranged in a position to allow gas flow from the substrate transfer space via the cover unit retraction chamber to the exhaust means, and further, an inert gas supply means is provided in the carrier open/close chamber; and a controller for regulating the exhaust quantity adjuster means is provided so that when supplying inert gas from the inert gas supply means to the carrier open/close chamber, the quantity of exhaust from the inert gas supply means becomes larger than the quantity of exhaust when inert gas is not being supplied.

(10) A semiconductor manufacturing apparatus according to the previous first aspect (1), wherein the carrier is structured to directly store multiple substrates.

(11) A semiconductor manufacturing apparatus according to the previous first aspect (1), wherein the carrier is structured to store a cassette holding multiple stacked substrates.

(12) A semiconductor device manufacturing method using a semiconductor manufacturing apparatus comprising a carrier in which a freely mountable/removable cover unit is provided on a substrate loading/unloading opening and a substrate is stored through the substrate loading/unloading opening, and a carrier open/close chamber continuously arranged to the carrier, and a substrate transfer chamber continuously arranged to the carrier open/close chamber, and a substrate processing chamber continuously arranged to the substrate transfer chamber, and an exhaust means for exhausting the atmosphere within the carrier open/close chamber by section, and an exhaust quantity adjuster means for regulating the suction exhaust quantity of the exhaust means, and an inert gas supply means for supplying inert gas to the carrier open/close chamber, and a controller for regulating the exhaust quantity of the exhaust quantity adjuster means, wherein the exhaust quantity of the exhaust quantity adjuster means is regulated so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber when the inert gas supply means supplies inert gas to the carrier open/close chamber.

(13) A semiconductor device manufacturing method according to the previous aspect (12), wherein the exhaust quantity adjuster means is regulated so that when supplying inert gas from the inert gas supply means to the carrier open/close chamber, the quantity of exhaust from the inert gas supply means becomes larger than the quantity of exhaust when inert gas is not being supplied.

(14) A semiconductor device manufacturing method according to the previous aspect (12), wherein the exhaust quantity of the exhaust quantity adjuster means is regulated so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber when the opening of the substrate transfer chamber connecting the carrier open/close chamber is closed.

(15) A semiconductor device manufacturing method according to any one of aspects (12) to (14), wherein the exhaust quantity of the exhaust quantity adjuster means is regulated so that the atmosphere within the apparatus flows from the transfer chamber to the carrier open/close chamber, and further from the carrier open/close chamber to outside the apparatus.

(16) A semiconductor device manufacturing method according to the previous aspect (12), wherein the exhaust quantity of the exhaust quantity adjuster means is regulated so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber when the substrate loading/unloading opening of the carrier with removable cover unit is open, and the opening of the substrate transfer chamber connecting the carrier open/close chamber is closed.

(17) A semiconductor device manufacturing method according to the previous aspect (12), wherein the exhaust quantity of the exhaust quantity adjuster means is regulated so that the pressure P1 outside the carrier open/close chamber is lower than the pressure P2 inside the carrier open/close chamber, and moreover that the pressure P2 inside the carrier open/close chamber is lower than the pressure P3 of the substrate transfer chamber when the substrate loading/unloading opening of the carrier with removable cover unit is open, the cover unit is retracted into a cover unit retraction chamber formed in the carrier open/close chamber, and a substrate transfer space is formed to allow passage of the substrate between the carrier open/close chamber and the substrate transfer chamber; and moreover the exhaust means allows gas flow from the substrate transfer space via the cover unit retraction chamber to the exhaust means.

(18) A semiconductor device manufacturing method according to the previous aspect (12), wherein the exhaust quantity of the exhaust quantity adjuster means is regulated so that the atmosphere within the apparatus flows from the transfer chamber to the carrier open/close chamber, and further from the carrier open/close chamber to outside the apparatus when the substrate loading/unloading opening of the carrier with removable cover unit is open, the cover unit is retracted into a cover unit retraction chamber formed in the carrier open/close chamber, and a substrate transfer space is formed to allow passage of the substrate between the carrier open/close chamber and the substrate transfer chamber; and moreover the exhaust means allows gas flow from the substrate transfer space via the cover unit retraction chamber to the exhaust means.

19. A semiconductor device manufacturing method comprising a substrate removal step for removing a substrate from a substrate storage chamber of a carrier storing the substrate, where a cover unit for closing a substrate loading/unloading opening of the substrate storage chamber is moved away by a pod opener, the substrate loading/unloading opening opens, inert gas flows while a pod opener chamber with the pod opener is in a sealed state, and inert gas is supplied to the substrate storage chamber, and a substrate storage step for storing the substrate in the empty carrier, where the cover unit is moved away by the pod opener before the substrate is stored in the empty carrier, the substrate loading/unloading opening opens, inert gas flows while the pod opener chamber is in a sealed state, and inert gas is supplied to the substrate storage chamber.

20. A semiconductor device manufacturing method according to the previous aspect (19), wherein the inert gas flow rate per unit of time in the substrate storage step is set to a larger flow rate than the inert gas flow rate per unit of time in the substrate removal step.

Effect of the Invention

The first aspect (1) renders the effect that adverse effects when the pod is open, such as particles adhesion to the substrate or natural oxidation film deposits on the substrate, as well as a rise in oxygen concentration and contamination of the substrate transfer chamber can be prevented by control to make the pressure P1 outside the carrier open/close chamber lower than the pressure P2 inside the carrier open/close chamber and this pressure P2 lower than the pressure P3 of the substrate transfer chamber.

The above aspects (19) and (20) render the effect that adverse effects when the pod is open, such as particles adhesion to the substrate or natural oxidation film deposits on the substrate, as well as a rise in oxygen concentration and contamination of the substrate transfer chamber can be prevented by effectively lowering the oxygen concentration within the carrier.

Moreover, particles and damage to the substrate can be prevented by preventing the so-called flopping of substrates stored in the substrate storage chamber of the carrier by limiting the inert gas flow rate to a small flow rate in the substrate removal step.

Conversely, the operating time for the entire process can be shortened by reducing the inert gas purge time by setting the inert gas flow rate to a large flow rate in the substrate storage step.

BEST MODE FOR CARRYING OUT THE INVENTION

Figure 1:
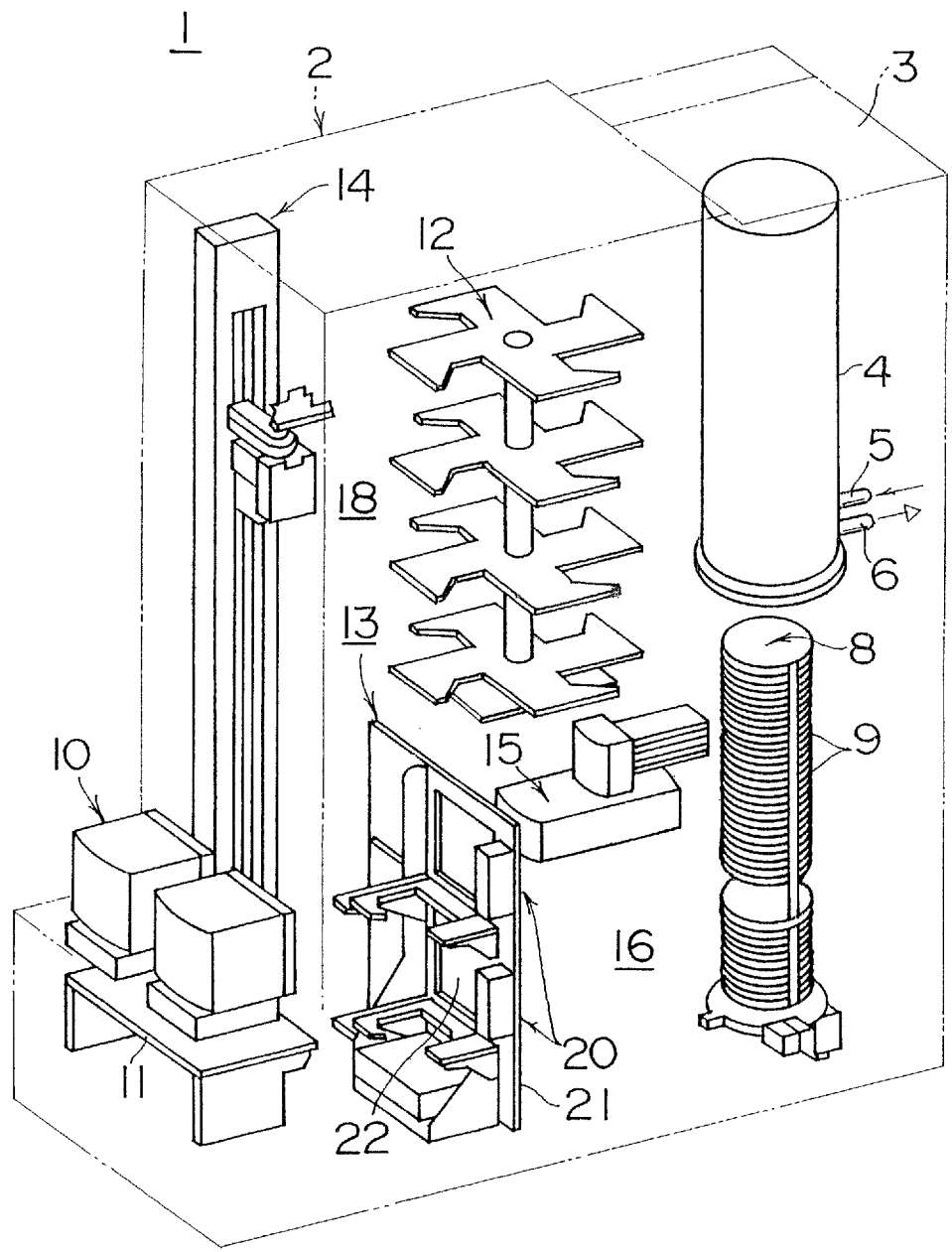
FIG. 1 is a partially abbreviated perspective view showing the batch type CVD apparatus of one embodiment of this invention.

An embodiment of the present invention is described next while referring to the drawings.

In this embodiment, the semiconductor manufacturing apparatus of the present invention is a batch type CVD apparatus, namely a batch type vertical diffusion CVD apparatus structured as shown in FIG. 1.

The batch type CVD apparatus shown in FIG. 1 includes a case 2 with an air-tight sealed structure. A heater unit 3 is installed perpendicularly on the upper side of one end (hereafter, rear end) inside the case 2. A process tube 4 is concentrically installed in the inside of the heater unit 3.

A gas supply pipe 5 for supplying raw material gas or purge gas into the process tube 4 is installed to connect to the process tube 4, and an exhaust pipe 6 for drawing a vacuum inside the process tube 4 is installed to connect to the process tube 4.

A boat elevator 7 (See FIG. 7) made up of a feed screw device driven by an electric motor is installed on the lower section at the rear end of the case 2. The boat elevator 7 is structured to vertically raise and lower a boat 8 installed directly below the process tube 4.

The boat 8 supports numerous wafers 9 arrayed horizontally and concentrically, and is structured to carry the wafers in and out of the processing chamber of the process tube 4.

A pod loading/unloading opening (not shown in drawing) is formed on the front side wall of the case 2. A front shutter opens and closes this pod loading/unloading opening. A pod stage 11 for aligning the position of a pod 10 is installed in the pod loading/unloading opening. The pod 10 is loaded and unloaded into the pod stage 11 via the pod loading/unloading opening.

A rotating type pod rack 12 is installed on the upper section at the center facing forward/rearward within the case 2. This rotating type pod rack 12 is structured to store a total of sixteen pods 10. Namely, the rotating type pod rack 12 has four levels of shelves in the shape of a simple cross with each leg bent 90 degrees to the left, installed vertically and supported to allow free rotation on a horizontal plane. The pod rack 12 is pitch-fed by an intermittent rotation drive mechanism such as motors (not shown in drawing) to rotate in one direction.

Figure 7:
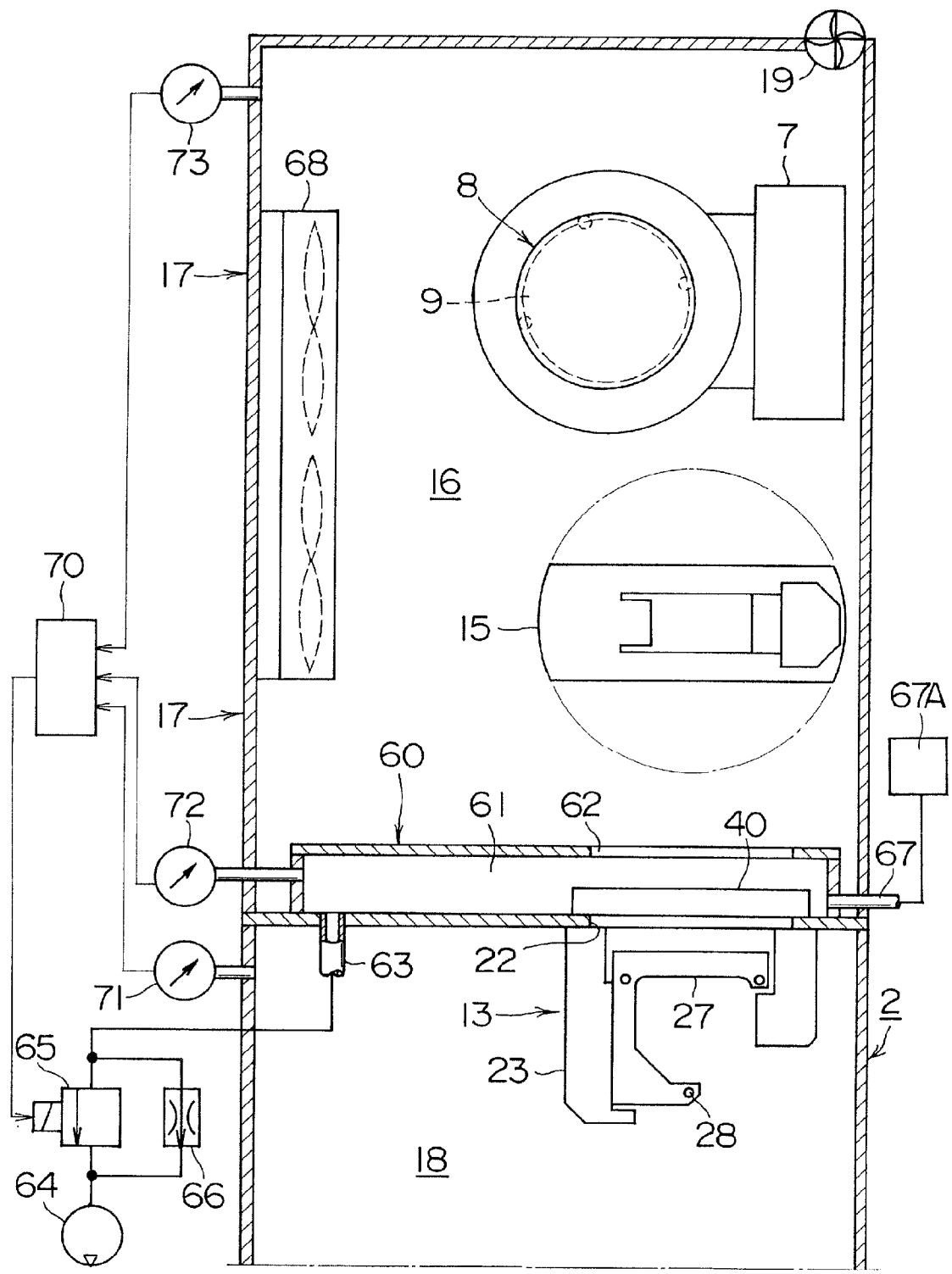
FIG. 7 is a partially abbreviated plan cross sectional view showing the batch type CVD apparatus.

A wafer transfer chamber case 17 forming a wafer transfer chamber 16 as the substrate transfer chamber is structured as shown in FIG. 7 below the pod rack 12 in the case 2. The pod rack 12 is installed on the wafer transfer chamber case 17.

As shown in FIG. 1, a pair of wafer transfer ports 13 for providing and receiving the wafers 9 as the substrates to the pods 10, are installed at two levels facing vertically in the front wall of the wafer transfer chamber case 17. Pod openers 20 described later on, are respectively installed in both the wafer transfer ports 13.

A pod transfer device 14 is installed in a pod transfer device chamber 18 within the case 2 as shown in FIG. 1. The pod transfer device 14 is structured to convey the pod 10 between the pod stage 11 and pod rack 12 and wafer transfer port 13, as well as between the pod rack 12 and wafer transfer port 13.

A wafer transfer device 15 is installed in the wafer transfer chamber 16. The wafer transfer device 15 conveys the wafers 9 between the wafer transfer port 13 and the boat 8.

An exhaust device 19 to evacuate the wafer transfer chamber 16 is installed on the rear wall of the wafer transfer chamber case 17 as shown in FIG. 7.

The pod openers 20, 20 installed in the upper and lower wafer transfer ports 13 possess an identical structure so the structure of the pod opener 20 installed in the upper stage wafer transfer port 13 is described.

As shown in FIG. 1, the pod opener 20 contains a base 21 as a carrier open/close device. This base 21 is a side wall standing perpendicularly to partition the wafer transfer port 13 and the wafer transfer device 15 in the case 2.

Figure 2:
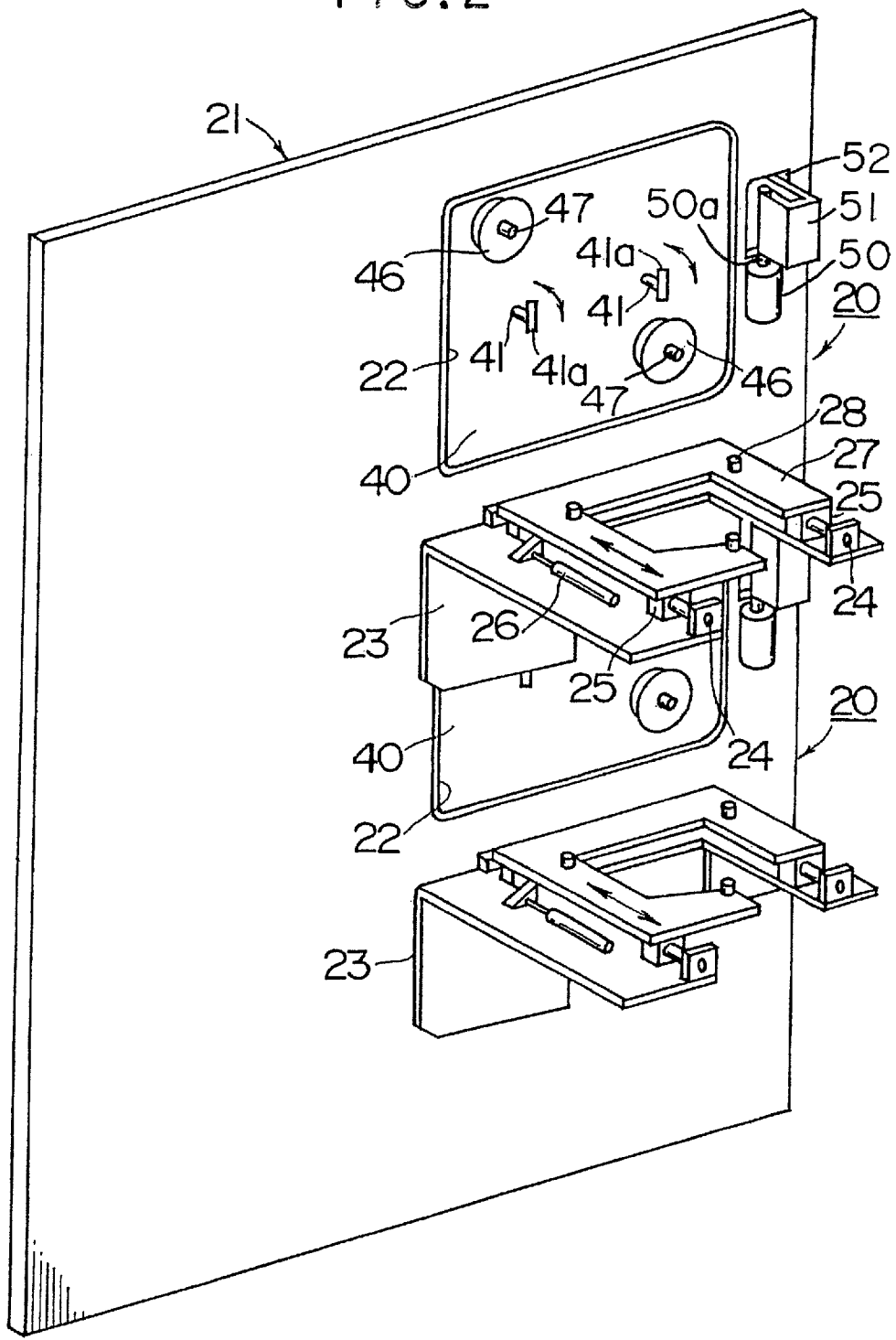
FIG. 2 is a perspective view showing the pod opener from the front side.
Figure 3:
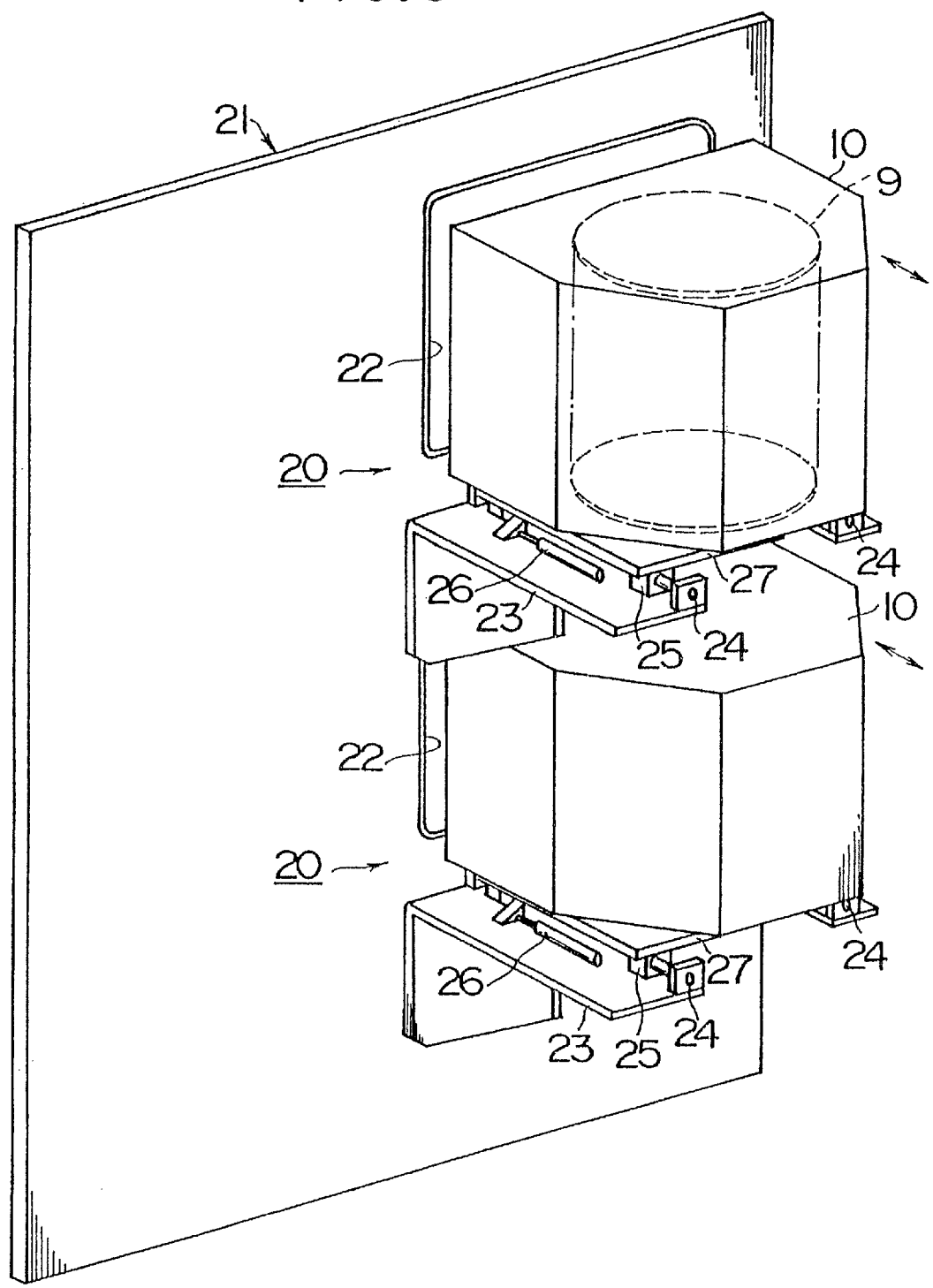
FIG. 3 is a perspective view showing the pod loaded state.

As shown in FIG. 2 and FIG. 3, a wafer loading/unloading opening 22 having a somewhat large four-cornered shape resembling the cover unit 10a (FIG. 8) for the pod 10 is formed on the base 21. The base 21 is jointly used by the upper and lower pod openers 20, 20 so that the pair of wafer loading/unloading openings 22, 22 are formed arrayed vertically on the base 21.

As shown in FIG. 2, an angle-shaped support stand 23 is clamped horizontally on the lower side of the wafer loading/unloading opening 22 on the main surface (hereafter, front surface) on the wafer transfer port 13 side of the base 21. The support stand 23 is formed in an approximately square frame shape with a notch on one section when viewed horizontally.

A pair of guide rails 24, 24 are mounted on the upper side of the support stand 23 in a direction parallel (hereafter, to left and right) to the front surface of the base 21, extending in a direction perpendicular (hereafter, to the front and rear) to the front surface of the base 21. A mount block 27 on the left/right guide rails 24, 24 is supported by multiple guide blocks 25 to allow free, sliding movement to the front and rear.

The mount block 27 is moved back and forth by an air cylinder device 26 installed on the upper side of the support stand 23.

As shown in FIG. 2, the mount block 27 is formed with a notch on one section in an approximately square shaped frame. Three positioning pins 28 are placed to protrude perpendicularly at the vertices of a regular triangle on the upper surface of the mount block 27.

In the state in which the pod 10 is mounted on the mount block 27 as shown in FIG. 3, the three positioning pins 28 are fitted into the three positioning concavities (not shown in drawing) formed on the lower surface of the pod 10.

Figure 4:
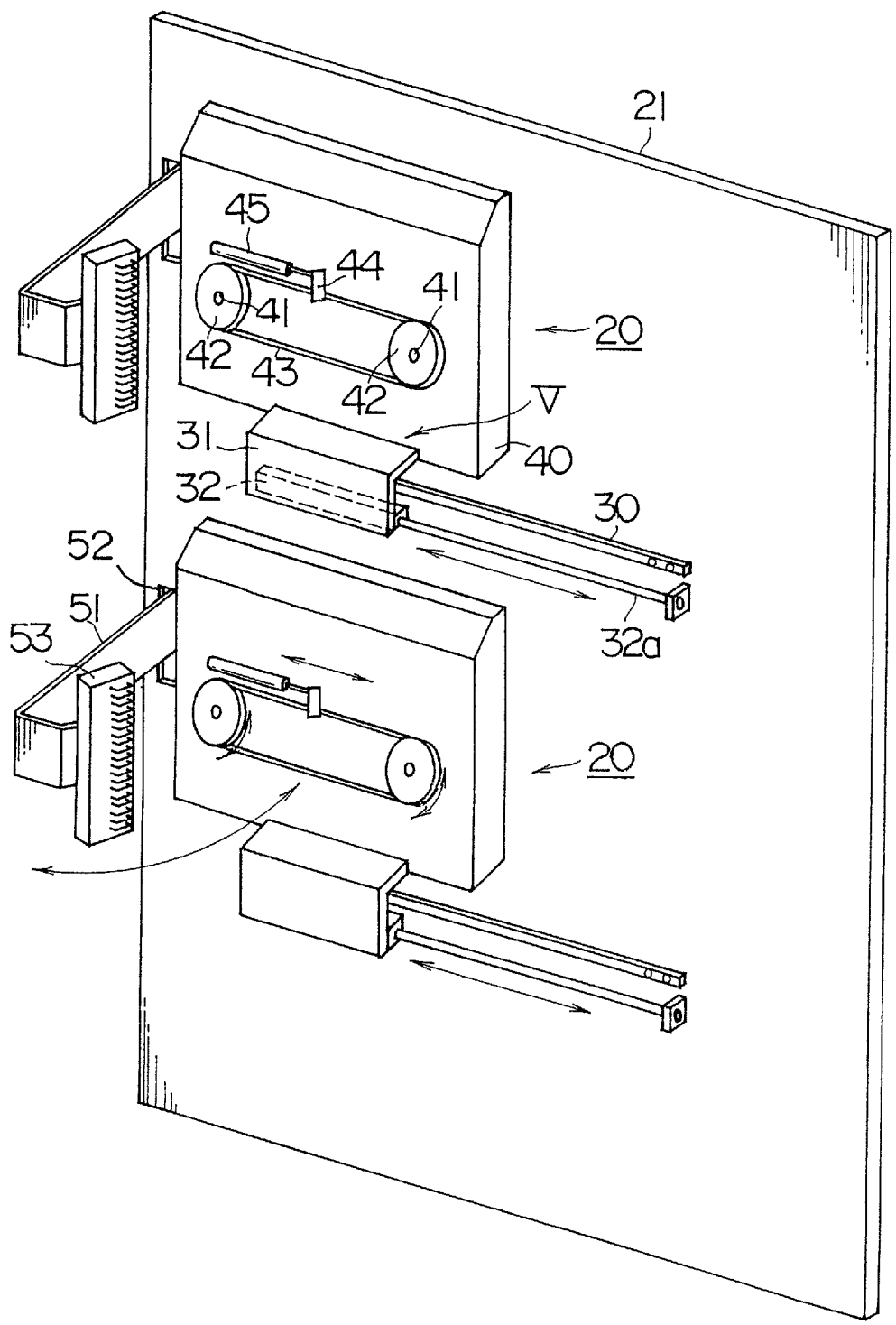
FIG. 4 is a partially abbreviated perspective view showing the pod opener without the pod opener chamber case as seen from the rear side.

As shown in FIG. 4, a guide rail 30 is provided horizontally extending to the left and right on the lower side of the wafer loading/unloading opening 22 on the main surface (hereafter, rear surface) on the wafer transfer device 15 side of the base 21. A right/left mover block (hereafter, first mover block) 31 formed in an angle shape, is supported on the guide rail 30 for free sliding movement to achieve back forth movement to the right and left.

An air cylinder device 32 is installed horizontally towards the right and left on the perpendicular member of the first mover block 31. The tip of the piston rod 32a on the air cylinder device 32 is clamped to the base 21. In other words, the first mover block 31 is moved back and forth in the left and right directions by the back and forth movement of the air cylinder device 32.

Figure 5:
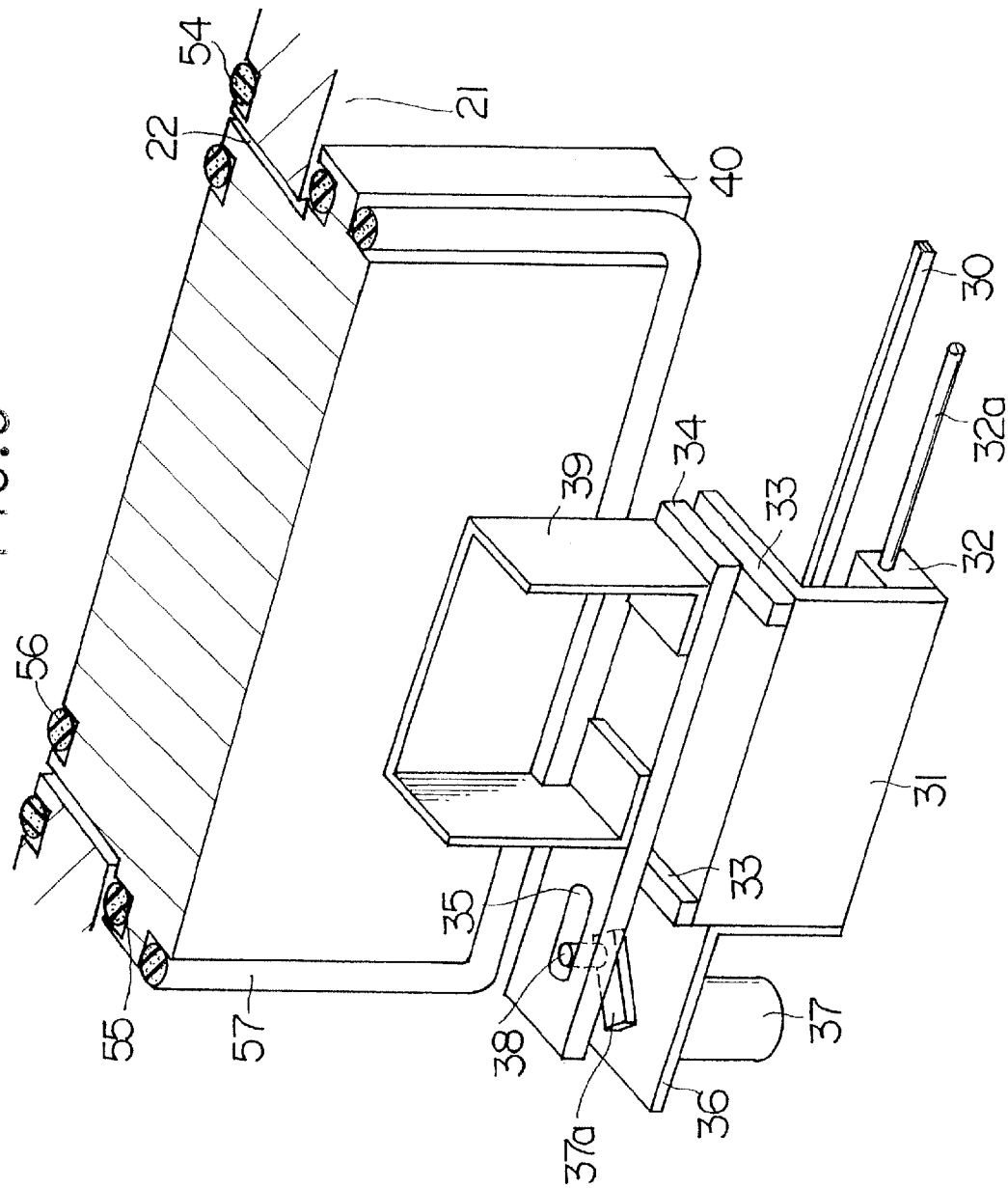
FIG. 5 is a perspective view showing the abbreviated V section of FIG. 4.

A pair of guide rails 33, 33 installed on the upper surface of the horizontal member of the first mover block 31 as shown in FIG. 5, are arrayed on the right and left, and extend to the front and rear directions. A front/rear mover block (hereafter, second mover block) 34 is supported for free sliding movement on both the guide rails 33, 33 to allow back and forth movement. A guide slot 35 is formed extending to the left/right on one end of the second mover block 34.

A bracket 36 is clamped on one side of the first mover block 31. A rotary actuator 37 is installed facing perpendicular to the bracket 36. A guide pin 38 erected upwards and perpendicular to the tip of the arm 37a on the rotary actuator 37 is inserted for free sliding movement in the guide slot 35 of the second mover block 34. In other words, the second mover block 34 is driven back and forth to the front and rear by the back and forth movement of the rotary actuator 37.

A bracket 39 is erected perpendicular to the upper side of the second mover block 34. A closure 40 is clamped perpendicular to the front surface of the bracket 39. The closure 40 is formed in a flat disk shape resembling a rectangle and somewhat larger than the wafer loading/unloading opening 22. In other words, the closure 40 is moved back and forth to the front and rear by the second mover block 34 and is moved back and forth to the left and right by the first mover block 31.

The closure 40 moves forward and the main surface (hereafter front surface) facing the base side makes contact with the rear surface of the base 21 to close the wafer loading/unloading opening 22.

A first packing 54 is provided on the periphery of the wafer loading/unloading opening 22 on the front side of the base 21 as shown in FIG. 5. The first packing 54 is structured to seal the wafer loading/unloading opening 22 of the base 21 and the wafer loading/unloading opening of the pod 10 when the pod 10 is pushed in.

A second packing 55 is provided near the outer circumferential edge on the front surface of the closure 40. The second packing 55 is structured to seal the wafer loading/unloading opening 22 of the base 21 during push-in by the closure 40.

A third packing 56 is provided on the inner side of the second packing 55 at the outer peripheral edge on the front side of the closure 40. The third packing 56 is structured to prevent intrusion of impurities adhering to the cover unit 10a, into the device chamber for the wafer transfer device 15.

A fourth packing 57 is provided on the outer peripheral edge on the rear side of the closure 40. The fourth packing 57 is structured to seal the wafer loading/unloading opening 62 of a pod opener chamber case 60.

The pod opener chamber case 60 is omitted from the drawings in FIG. 4 and FIG. 5 for purposes of simplicity.

As shown in FIG. 4, a pair of release shafts 41, 41 are inserted along the forward and reverse directions on the left and right on the centerline of the closure 40. The pair of release shafts 41, 41 are respectively supported to allow free rotation.

A pair of pulleys 42, 42 are affixed to the ends of both the release shafts 41,41 on the main side (hereafter, rear side) opposite the base of the closure 40. A belt 43 containing a link piece 44 is wound between both the pulleys 42, 42. An air cylinder device 45 is horizontally affixed to the upper side of one of the pulleys 42 on the rear side of the closure 40. The tip of the piston rod of the air cylinder device 45 is linked to the link piece 44 of the belt 43. In other words, the pair of release shafts 41, 41 are rotated by the operations of the expansion and contraction of the air cylinder device 45.

As shown in FIG. 2, engage pieces 41a to engage with the cover unit 10a latch (not shown in drawing) is formed protruding and intersecting at a right angle on the ends of the release shafts 41,41 on the front side of the closure 40.

As shown in FIG. 2, two suction pieces (suction disk) 46 for attaching on the cover unit 10a surface are respectively clamped by the suction port member 47 near one of the opposite angles on the front surface of the closure 40. The suction port member 47 for clamping the suction piece 46 is made up of a hollow shaft. The rear side edge of the suction port member 47 is connected to the supply/exhaust path (not shown in drawing).

The outer diameter of the front side edge of the suction port member 47 is set to fit into a positioning hole (not shown in drawing) formed in the cover unit 10a. In other words, the suction port member 47 inserts into the positioning hole of the cover unit 10a, and serves as a support pin for mechanically supporting the cover unit 10a.

Figure 6:
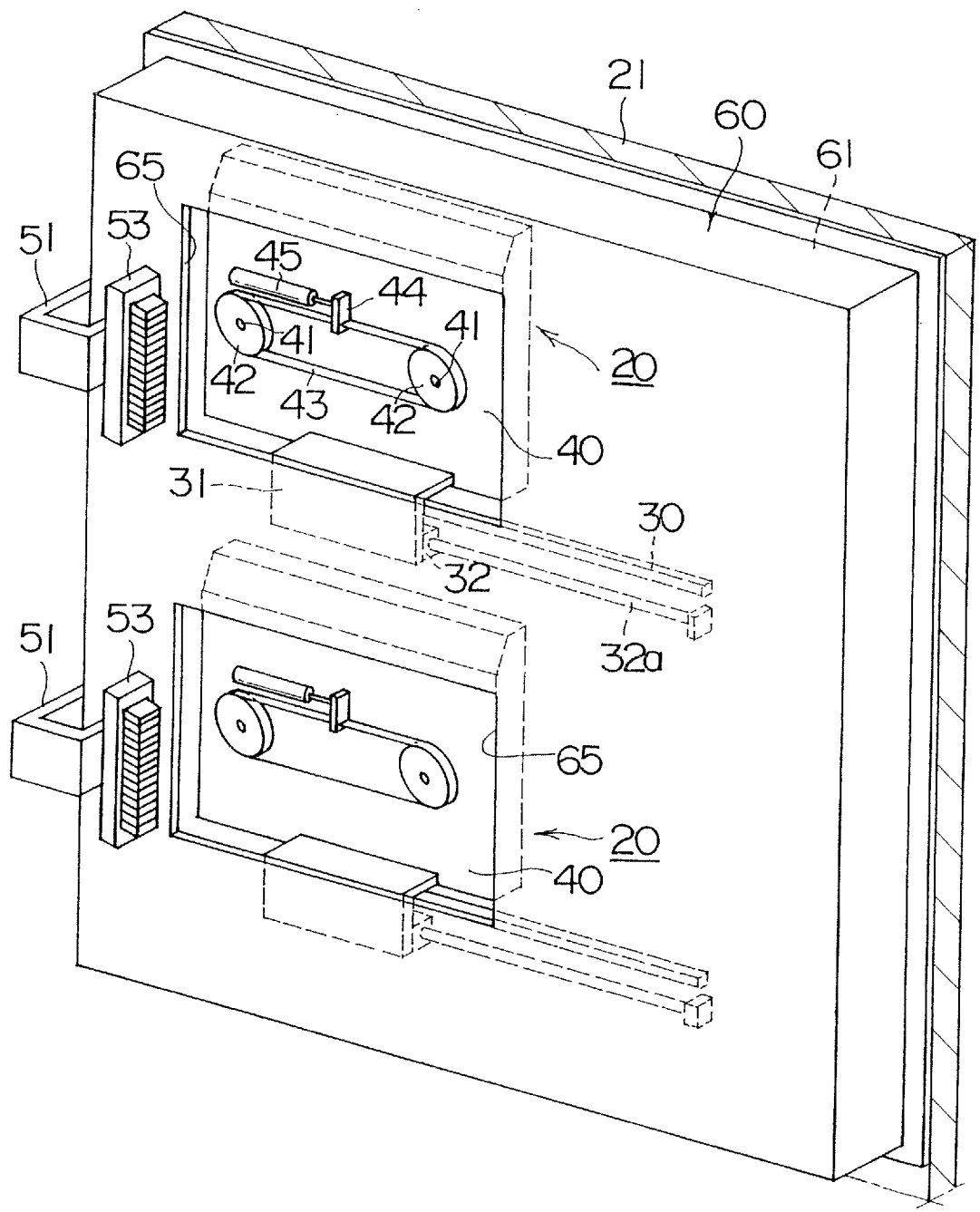
FIG. 6 is a perspective view showing the pod opener with the pod opener chamber case as seen from the rear side.

As shown in FIG. 2, FIG. 4, and FIG. 6, a rotary actuator 50 (See FIG. 2.) is installed on one flank of the wafer loading/unloading opening 22 on the front surface of the base 21 so that the rotating shaft 50a (See FIG. 2.) of the rotary actuator 50 is oriented perpendicularly. One end of an arm 51 formed in approximately a C-shape is affixed to the rotating shaft 50a for unified movement on the horizontal plane.

The arm 51 is inserted into an insertion hole 52 (See FIG. 4.) formed in the base 21. A mapping device 53 is clamped to the tip of the arm 51 on the rear surface side of the base 21.

A pod opener case (hereafter called, opener case) 60 is installed on the rear side of the base 21 as shown in FIG. 6 and FIG. 7. The opener case 60 forms a pod opener chamber 61 that serves as the carrier open/close chamber. The opener case 60 also holds the closure 40. The horizontal length of the pod opener chamber 61 of the opener case 60 is set to allow the closure 40 to move laterally and completely open the wafer loading/unloading opening 22.

A wafer loading/unloading opening 62 of the opener case 60 is formed at a position facing the wafer loading/unloading opening 22 on the rear wall of the opener case 60. The wafer loading/unloading opening 62 is formed as an opening with a four cornered shape capable of being sealed by the closure 40 rear section.

The wafer loading/unloading opening 62 is set to allow the mapping device 53 insertion from the rear side.

As shown in FIG. 7, an intake port for an exhaust pipe 63 serving as the exhaust means for evacuating the pod opener chamber 61, connects to the pod opener chamber 61 at a position opposite the wafer loading/unloading opening 22 of the base 21 functioning as the front wall of the opener case 60. The delivery end of the exhaust pipe 63 connects to a pump 64 for drawing a vacuum.

A bypass line 66 is provided connecting to the exhaust pipe 63. The bypass line 66 constitutes a fixed throttle along with an open/close valve 65 to serve as the exhaust quantity adjuster means. A controller 70 regulates the open/close valve 65.

One end of an intake pipe 67 serving as the inert gas supply means connects to a position opposite the exhaust pipe 63 on the rear wall of the opener case 60. The other end of the intake pipe 67 connects to an intake device 67A.

An intake device 68 serving as the inert gas supply means is installed within the wafer transfer chamber 16 as the substrate transfer chamber. This intake device 68 blows nitrogen gas 69 as the inert gas.

As shown in FIG. 7, a first pressure meter 71, a second pressure meter 72, and a third pressure meter 73 are connected to the case 2. These pressure meters 71, 72, and 73 send the measurement results to the controller 70. The first pressure meter 71 measures the pressure $P_1$ of the pod transfer device chamber 18 serving as the chamber outside the pod opener chamber 61. The second pressure meter 72 measures the pressure $P_2$ within the pod opener chamber 61. The third pressure meter 73 measures the pressure $P_3$ of the wafer transfer chamber 16 serving as the substrate transfer chamber continuously arranged to the pod opener chamber 61.

The controller 70 is made up of hardware such as a panel computer, a personal computer, or a microcomputer; and the software programmed for that hardware. The controller 70 implements the operation described later on, based on measurement results from the pressure meters 71, 72, and 73, etc.

The film forming process in the IC manufacturing method for one embodiment of this invention is described next for the case using the batch type CVD apparatus described above.

In order to simplify the description, one wafer transfer port 13 is the upper level port A, and the other wafer transfer port 13 is the lower level port B.

As shown in FIG. 1, the pod 10 that was carried into the pod stage 11 inside the case 2 from the pod load/unload port, is conveyed to the pod rack 12 by the pod transfer device 14 and stored.

The pod 10 stored in the pod rack 12 is picked up by the pod transfer device 14 and conveyed to the upper level port A and transferred to the mount block 27 of the pod opener 20 as shown in FIG. 3.

The positions of the pod 10 and the mount block 27 are aligned at this time by the three positioning pins 28 of the mount block 27 fitting into the respective positioning cavities formed in the bottom side of the pod 10.

Figure 8:
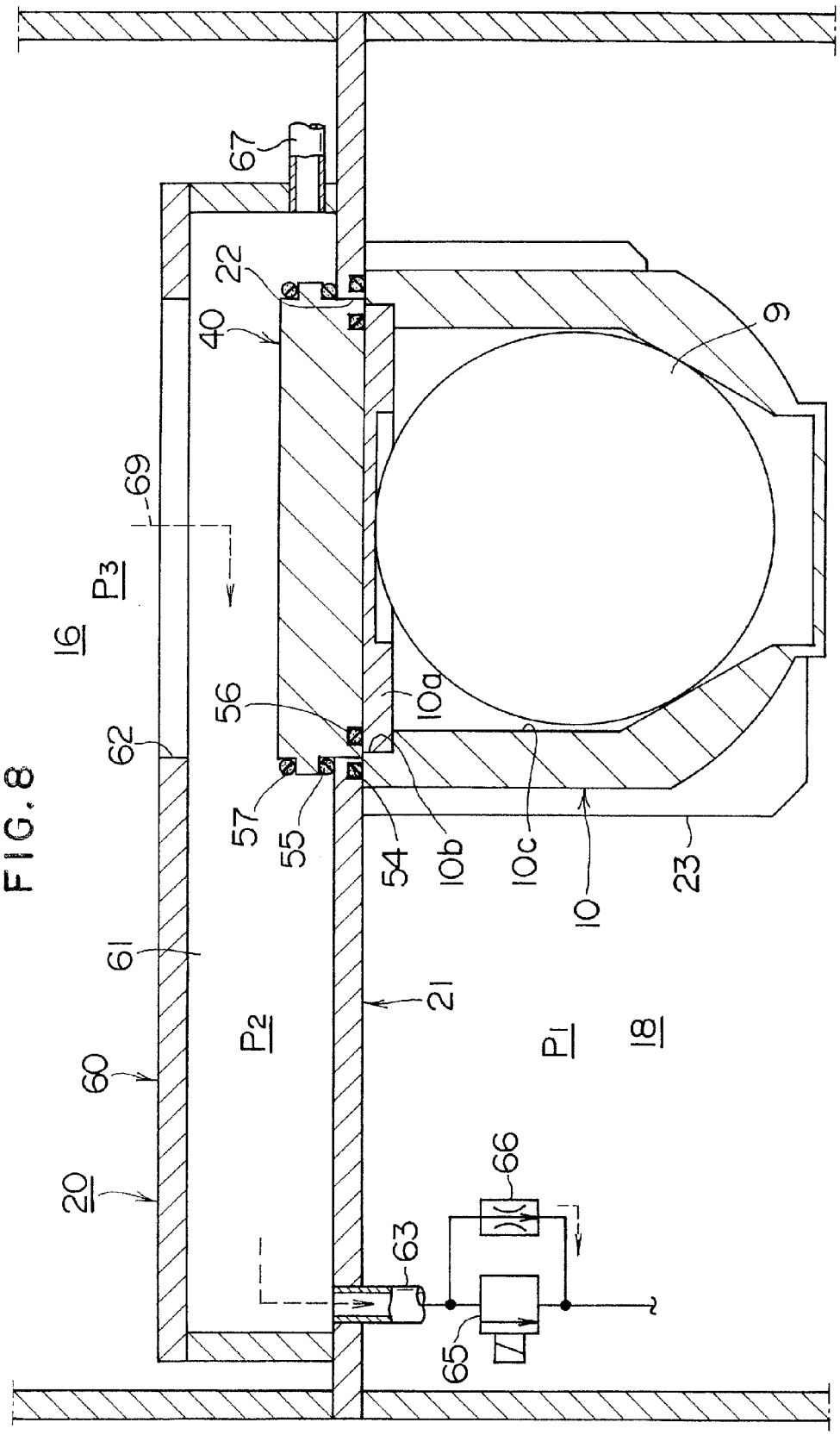
FIG. 8 is a partially abbreviated plan cross sectional view for describing the function of the pod opener chamber, prior to removal of the cover unit.

When the pod 10 is loaded on the mount block 27 and position aligned, the mount block 27 is pressed towards the base 21 by the air cylinder device 26, and as shown in FIG. 8, the edge on the open side of the pod 10 is pressed towards the open edge of the wafer loading/unloading opening 22 on the front surface of the base 21. When the pod 10 is pressed towards the base 21, the release shaft 41 of the closure 40 is inserted into the key hole of the cover unit 10a.

The cover unit 10a of the pod 10 is next held by the vacuum on the suction piece 46 by supplying negative pressure from the intake/exhaust passage to the suction port member 47 of the closure 40.

When the air cylinder device 45 swivels the release shaft 41 in this state, the release shaft 41 releases the cover unit 10a latch with the engage piece 41a engaging with the cover unit 10a latch.

The seal made by the first packing 54 between the pod 10 and the base 21, as well as the seal made by the second packing 55 between the closure 40 and the base 21 are simple. A large pressure differential between the pressure $P_1$ of the pod transfer device chamber (hereafter called, device chamber) 18 and the pressure $P_2$ of the pod opener chamber 61 will therefore cause a leak.

The present embodiment is capable of handling such leaks since the controller 70 closes the open/close valve 65 so that the pressure $P_1$ of the device chamber 18 becomes smaller ($P_1<P_2$) than the pressure $P_2$ of the pod opener chamber 61. In other words, closing the open/close valve 65 regulates the pressure to $P_1<P_2$ since the exhaust flow of the exhaust pipe 63 is limited to a small quantity by the bypass line 66.

Therefore, even if a leak occurs due to a large pressure differential, the intrusion of an atmosphere containing contaminant substances such as oxygen from the device chamber 18 into the pod opener chamber 61 can be prevented by controlling the pressure to $P_1<P_2$ and in this way, unforeseen contamination of the pod opener chamber 61 can be prevented.

The pressure $P_1$ of the device chamber 18 incidentally is the same pressure outside the case 2 or in other words is the same as the clean room pressure which is approximately atmospheric air pressure. The relations $P_1<P_2$ and $P_1<P_3$ therefore deteriorates when the exhaust flow from the exhaust pipe 63 is large. So in order to maintain these relations, a large quantity of nitrogen gas 69 must be supplied from the intake pipe 67 and the intake device 68, which increases the running costs.

The present embodiment, however, is capable of limiting the exhaust flow from the exhaust pipe 63 to a small quantity via the bypass line 66 by closing the open/close valve 65 and is capable of limiting the flow of nitrogen gas 69 so that a rise in costs can be prevented. Moreover, structure and control can be simplified by utilizing the open/close valve 65 and the bypass line 66 as the exhaust quantity adjuster means, so that cost rises can be suppressed even further.

Figure 9:
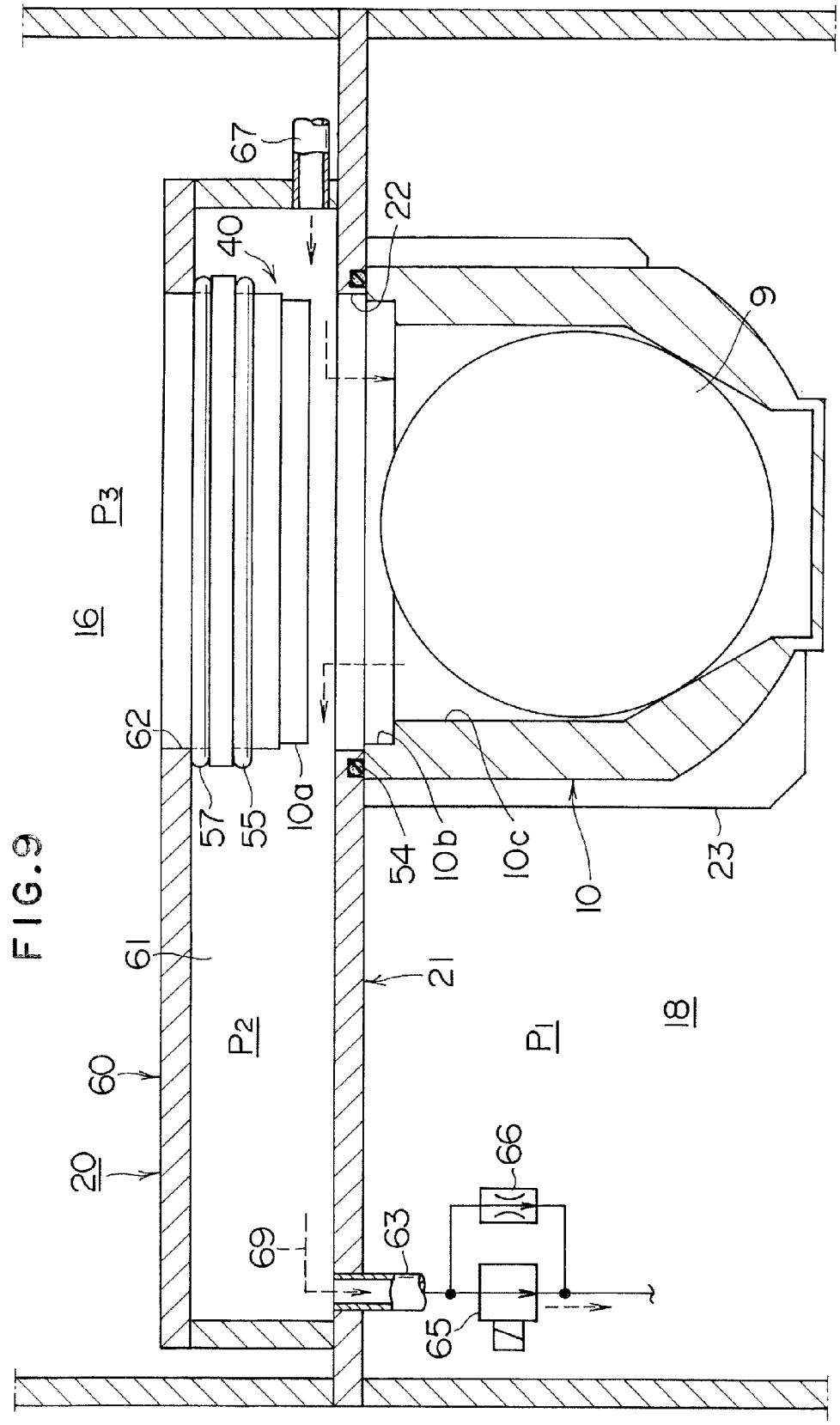
FIG. 9 is a partially abbreviated plan cross sectional view showing the same when the pod opener chamber is sealed.

When the rotary actuator 37 operates to move the second mover block 34 in a direction away from the base 21 after the cover unit 10a of the pod 10 was released, as seen in FIG. 9, the closure 40 holding the cover unit 10a of the pod 10 by vacuum retracts from the pod opener chamber 61 to remove the cover unit 10a from the wafer loading/unloading opening 10b of the pod 10. The wafer loading/unloading opening 10b of the pod 10 is in this way set to an open released state.

As shown in FIG. 9, when the closure 40 is further retracted by the second mover block 34, the packing 57 on the rear wall of the closure 40 is pressed from the inner side of the pod opener chamber 61 against the periphery of the wafer loading/unloading opening 62 on the rear wall of the opener case 60 so that the pod opener chamber 61 is set to a sealed state by the closure 40 and the pod 10.

As shown in FIG. 9, when the pod opener chamber 61 is sealed by the closure 40 and the pod 10, nitrogen gas 69 flows into the pod opener chamber 61 from the intake pipe 67 and is exhausted via the exhaust pipe 63.

Along with exhausting the air from the wafer storage chamber 10c by making the nitrogen gas 69 to flow in the pod opener chamber 61 flow into the wafer storage chamber 10c of the pod 10 from the wafer loading/unloading opening 10b and flow out, the wafer storage chamber 10c is filled with the nitrogen gas 69. The air and moisture within the atmosphere in the wafer storage chamber 10c of the pod 10 and the pod opener chamber 61 are consequently purged by the nitrogen gas 69.

The purge time can also be shorted by speeding up the injection amount and flow speed of the nitrogen gas 69 via a forced flow. The oxygen gas concentration at this time is preferably 20 ppm or less.

However, when the closure 40 removes the cover unit 10a from the pod 10, the wafer storage chamber 10c of the pod 10 is connected to the pod opener chamber 61.

Whereupon, in this embodiment, the controller 70 regulates the open/close valve 65, so that the pressure $P_2$ of the pod opener chamber 61 becomes smaller than the pressure $P_3$ of the wafer transfer chamber 16 ($P_2<P_3$).

First of all, there is the possibility that contaminant substances such as moisture and oxygen in the wafer storage chamber 10c of the pod 10 might penetrate into the wafer transfer chamber 16 via both wafer loading/unloading openings 22 and 62 during the closure 40 transition state, or in other words the intermediate state (lasting about 1 to 1.5 seconds) where neither the wafer loading/unloading opening 22 of the base 21 or the wafer loading/unloading opening 62 on the rear wall of the opener case 60 is closed by the closure 40.

In the present embodiment, contaminant substances flowing into the pod opener chamber 61 from the wafer storage chamber 10c of the pod 10 do not flow into the wafer transfer chamber 16, since the pressure $P_2$ of the pod opener chamber 61 is regulated to a smaller pressure than the pressure $P_3$ of the wafer transfer chamber 16 ($P_2<P_3$) and therefore the unexpected contamination of the wafer transfer chamber 16 is prevented.

In the state shown in FIG. 9, where the closure 40 is at the most retracted state, the packing 57 of the closure 40 maintains the wafer loading/unloading opening 62 in a sealed state so that contaminant substances from the pod opener chamber 61 are not likely to flow into the wafer transfer chamber 16.

However, the seal attained by the fourth packing 57 is simple and therefore a leak might occur from the pod opener chamber 61 into the wafer transfer chamber 16 when the pressure $P_2$ of the pod opener chamber 61 becomes larger than the pressure $P_3$ of the wafer transfer chamber 16 ($P_2 > P_3$).

In this embodiment, the pressure $P_2$ of the pod opener chamber 61 is regulated to a smaller pressure than pressure $P_3$ of the wafer transfer chamber 16 ($P_2 < P_3$) so that even if the packing 57 of the closure 40 is a simple seal, leaks into the wafer transfer chamber 16 from the pod opener chamber 61 can be prevented and therefore contamination of the wafer transfer chamber 16 can be prevented.

Figure 10:
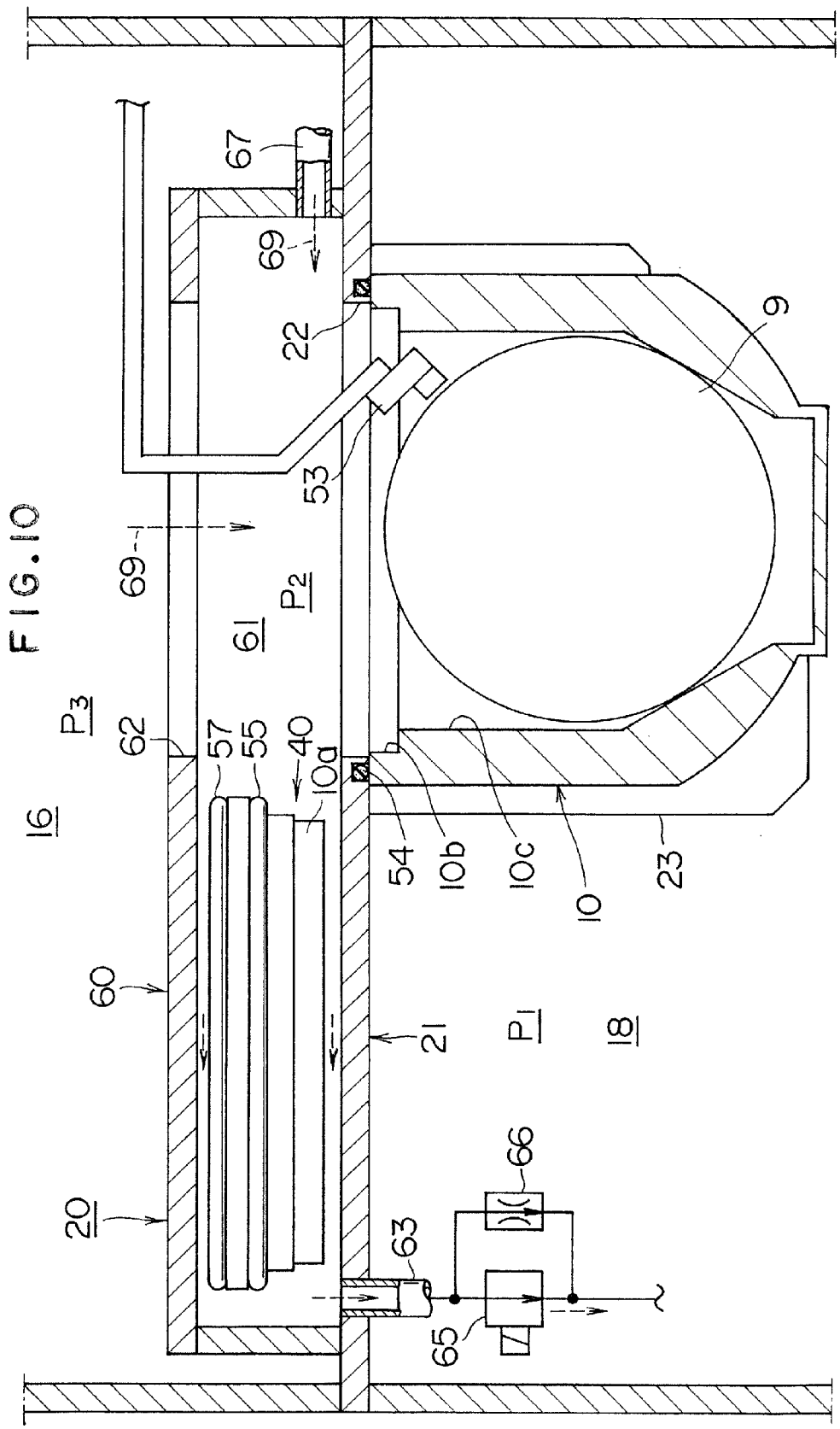
FIG. 10 is a partially abbreviated plan cross sectional view showing the same during mapping.

When the wafer storage chamber 10c of the pod 10 and the pod opener chamber 61 are purged by nitrogen gas 69 in this way, the first mover block 31 is moved away from the wafer loading/unloading opening 22 by the action of the air cylinder device 32. Thus, the closure 40 with the cover unit 10a held by vacuum by the suction piece 46, moves to a retraction position away from the wafer loading/unloading opening 62 in the pod opener chamber 61 as seen in FIG. 10.

This retraction movement by the closure 40 respectively sets the wafer loading/unloading opening 62 of the opener case 60, the wafer loading/unloading opening 22 of the base 21 and the wafer loading/unloading opening 10b of the pod 10 to the released state.

In this case, the pod opener chamber 61 and the wafer storage chamber 10c of the pod 10 are already purged by nitrogen gas 69 so that there is no discharge of moisture or air from the atmosphere into the wafer transfer chamber 16, and therefore adverse effects such as from a rise in the oxygen concentration or contaminants in the wafer transfer chamber 16 can be prevented.

The seal achieved by the first packing 54 between the pod 10 and the base 21 is simple and therefore leaks might occur when the pressure differential between the pressure $P_1$ of the device chamber 18, the pressure $P_2$ of the pod opener chamber 61 and the pressure $P_3$ of the wafer transfer chamber 16 becomes large.

Whereupon in this embodiment, the controller 70 regulates the open/close value 65, the intake device 67a of the intake pipe 67 and the intake device 68 so that the relation between the pressure $P_1$ of the device chamber 18, the pressure $P_2$ of the pod opener chamber 61 and the pressure $P_3$ of the wafer transfer chamber 16 becomes $P_1 < P_2 < P.sub.3$. This control serves to prevent the atmosphere within the device chamber 18 from leaking into the pod opener chamber 61 and the wafer transfer chamber 16 so that unexpected contamination of the wafer transfer chamber 16 can be prevented.

However, the clearances between the side surface of the pod opener chamber 61 and the side surface of the closure 40 as well as the main surface of the cover unit 10a are respectively about 5 to 20 millimeters. Therefore, when the closure 40 holding the cover unit 10a slides in the pod opener chamber 61, the space on the exhaust pipe 63 side of the pod opener chamber 61 is compressed.

When this compression phenomenon occurs, the contaminant substance and particles of the pod opener chamber 61 drift upward and flow into the wafer transfer chamber 16 side via the clearances between the side surfaces of the pod opener chamber 61 and the closure 40 as well as the main surface of the cover unit 10a, so that the wafer transfer chamber 16 might become contaminated.

In this embodiment, the compression in the forward slide space of the closure 40 in the pod opener chamber 61 is prevented by control to obtain a larger exhaust quantity from the exhaust pipe 63. Consequently, the adverse effects that accompany the compression phenomenon can be prevented.

Setting a large exhaust flow in the exhaust pipe 63 increases the flow of nitrogen gas 69 in the clearance between the main surface of the cover unit 10a and the side surfaces of the pod opener chamber 61 and the closure 40 so that the reverse flow from the slide forward space of the closure 40 into the slide rearward space in the pod opener chamber 61 can be prevented. In other words, even if the drift occurs upward, intrusion of unwanted substances into the wafer transfer chamber 16 can be prevented.

When the closure 40 is retracted as shown above, as shown in FIG. 10, the rotary actuator 50 operates to move the mapping device 53. So the mapping device 53 passes through the wafer loading/unloading opening 62 on the rear wall of the opener case 60, the wafer loading/unloading opening 22 of the base 21 and the wafer loading/unloading opening 10b of the pod 10 and inserts into the wafer storage chamber 10c of the pod 10.

The mapping device 53 inserted into the wafer storage chamber 10c of the pod 10 performs mapping by detecting the multiple wafers 9 stored in the wafer storage chamber 10c.

When the specified mapping task is complete, the rotary actuator 50 operates to return the mapping device 53 back to the original standby position.

This mapping is a task for confirming the resident positions of the wafers 9 (the supporting groove where the wafers 9 present) in the wafer storage chamber 10c of the pod 10.

When the mapping device 53 returns to the standby position, the wafer transfer device 15 sequentially charges the multiple wafers 9 of the opened pod 10 in the upper level port A into the boat 8. Adverse effects such as a rise in the oxygen concentration or contamination of the wafer transfer chamber 16 are prevented so that unwanted problems such as particles adhesion to the wafers 9 or natural oxidation film deposits on the wafers 9 are prevented during transfer.

During this charging operation for charging the wafers 9 into the boat 8 by the wafer transfer device 15 in the upper level port A, the pod transfer device 14 conveys another pod 10 from the pod rack 12 and transfers it to the lower level port B, and the tasks proceed simultaneously from the previously described positioning task by the pod opener 20 to the mapping task.

When the tasks simultaneously proceed to the mapping task in the lower level port B in this way, the charging operation of the wafers 9 into the boat 8 by the wafer transfer device 15 in the pod 10 standing by at the lower level port B can start simultaneous with the ending of the operation for charging the wafers 9 into the boat 8 at the upper level port A. In other words, the throughput of the batch type CVD apparatus 1 can be increased since the wafer transfer device 15 allows continuously performing wafer transfer without wasting any time in standby in the task of the pod 10 replacement.

When the charging of the wafers 9 into the boat 8 in the upper level port A is completed by the wafer transfer device 15, the task of closing the empty pod is performed in the reverse sequence of the above described pod opening task.

Namely, the first mover block 31 returns the cover unit 10a held and retracted by the closure 40 to the position of the wafer loading/unloading opening 22. The second mover block 34 inserts it into the wafer loading/unloading opening 22, and into the wafer loading/unloading opening 10b of the pod 10. When the cover unit 10a is inserted into the wafer loading/unloading opening 10b, the air cylinder device 45 swivels the release shaft 41, and engages the cover unit 10a latch. When finished latching the cover unit 10a, the vacuum hold by the suction piece 46 is released by switching the negative pressure supplied to the suction port member 47 from the intake/exhaust path to release to the atmospheric air.

The air cylinder device 26 next moves the mount block 27 away from the base 21, and the edge on the open side of the pod 10 is positioned away from the front surface of the base 21.

The nitrogen gas 69 that was filled into the wafer storage chamber 10c is sealed into the wafer storage chamber 10c when the cover unit 10a closes the wafer loading/unloading opening 10b in this way.

The empty pod 10 in the upper level port A whose wafer loading/unloading opening 10b was sealed by the cover unit 10a, is temporarily conveyed back to the pod rack 12 by the pod transfer device 14.

The next pod 10 is conveyed to the upper level pod A when the empty pod 10 is conveyed from the upper level pod A.

The above described operation is repeated as many times as needed in the upper level port A and the lower level port B.

Multiple wafers 9 are in this way charged from the pod 10 into the boat 8, by the charging operation where the wafer transfer device 15 mutually repeats the process of charging the wafers 9 into the boat 8 in the upper level port A and lower level port B.

In this case, the number of wafers 9 (for example, 100 to 150 wafers) for batch processing is several times larger than the number of wafers 9 stored in one pod 10 unit (for example, 25 wafers) so that multiple pod 10 units are alternately and repeatedly supplied by the wafer transfer device 14 to the upper level port A and lower level port B.

The wafer removal step for removing the wafers from the storage chamber of the pod where the wafers were stored was described up to this point.

However, when the closure 40 released the cover unit 10a from the pod 10 in the previously described wafer removal step, the wafer storage chamber 10c of the pod 10 then becomes connected to the pod opener chamber 61 so that the atmosphere (air) within the wafer storage chamber 10c of the pod 10 and the atmosphere (nitrogen gas) within the pod opener chamber 61 as well as the wafer transfer chamber 16 become intermixed. The oxygen concentration in the pod opener chamber 61 and the wafer transfer chamber 16 therefore rises.

For example, when the volume of the wafer storage chamber 10c of the pod 10 is 0.001 cubic meters (100l), and the oxygen concentration of the wafer storage chamber 10c is 10,000 ppm. (1%), the volume of the pod opener chamber 61 and the wafer transfer chamber 16 is 2 cubic meters (2000l), and the oxygen concentration of the pod opener chamber 61 and the wafer transfer chamber 16 is 30 ppm, then the oxygen concentration of the pod opener chamber 61 and the wafer transfer chamber 16 becomes 500 ppm when mixed.

In order to find methods for suppressing the rise in oxygen concentration in the pod opener chamber 61 and the wafer transfer chamber 16 while the pod 10 was opened, experiments were made to find the change in oxygen concentration occurring during nitrogen gas purge of the pod opener chamber and the wafer transfer chamber. Results from those experiments are shown in the graph in FIG. 11.

Figure 11:
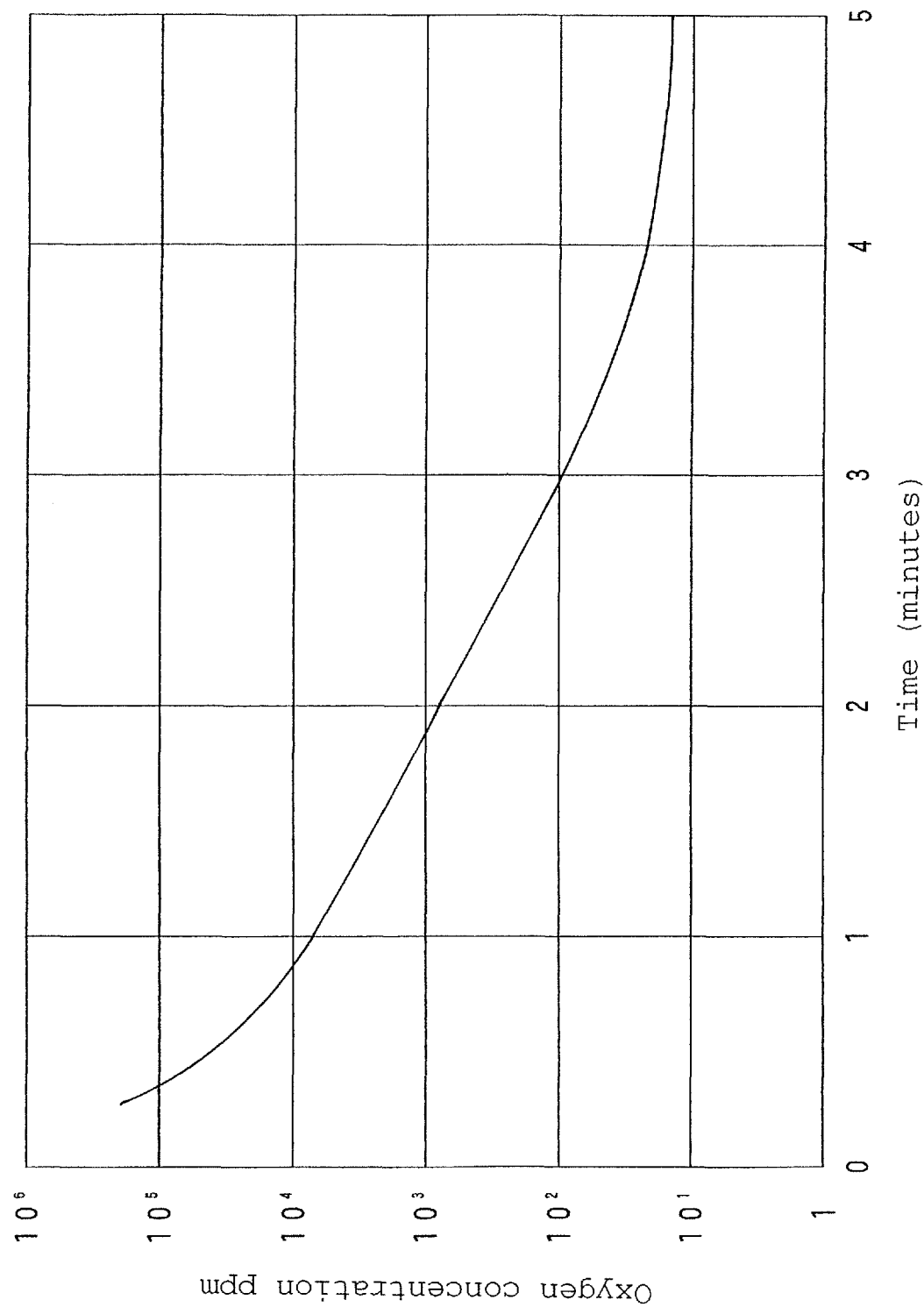
FIG. 11 is a graph showing changes in the oxygen concentration after nitrogen gas purge.

In FIG. 11, the vertical axis expresses the oxygen concentration (ppm) on a logarithmic scale, and the horizontal axis expresses the time in "Minutes". The graph in FIG. 11 shows an average and smooth drop in the oxygen concentrations for three pods when all were respectively opened.

In FIG. 11, one minute was required to reach 10,000 ppm, 2 minutes were required to reach 1,000 ppm, 3 minutes were required to reach 100 ppm, and 4 minutes were required to reach 30 ppm.

In FIG. 11, the oxygen concentration declined logarithmically when the pod opener chamber and the wafer transfer chamber were purged with nitrogen gas. One can see that slope of this decline became gradually smoother, and finally leveled off. The drop in oxygen concentration can be observed to become gradually smoother at about 10 ppm.

In this embodiment, prior to the closure 40 opening the cover unit 10a of the pod 10, the controller 70 regulates the exhaust flow from the exhaust pipe 63 and the intake flow of the nitrogen gas 69 from the intake device 68 as well as the intake pipe 67 as previously described, and the nitrogen gas 69 purges the pod opener chamber 61 and the wafer transfer chamber 16. This purge by nitrogen gas causes the oxygen concentration in the pod opener chamber 61 and the wafer transfer chamber 16 to drop to a preset value or below.

This oxygen concentration is set to a level that is for example satisfactory for boat loading and is also a value that does not exceed the upper threshold value (Here, a value that may rise up to a certain point.) for the wafer transfer chamber 16 oxygen concentration when the pod 10 is opened.

The phenomenon causing a natural oxidation film to form on the wafer is prevented when the wafer transfer chamber 16 oxygen concentration is 70 ppm or below, so that the value to be preset is 70 ppm oxygen concentration.

The throughput of the batch type CVD apparatus declines when the standby time until the closure 40 opens the cover unit 10a of the pod 10 becomes long. Therefore, the nitrogen gas purge time prior to opening of the cover unit 10a of the pod 10 by the closure 40 must preferably be set to as short a time as possible.

The throughput of the batch type CVD apparatus is improved by opening the cover unit 10a of the pod 10 using the closure 40 at the point in FIG. 11 just before the declining slope of the oxygen concentration become smooth, namely at the point in time where nitrogen gas replacement efficiency is high.

The method for finding the pod purge time is specifically described next.

Here, the volume of the wafer storage chamber of the pod is set as 20 liters, the volume of the pod opener chamber and the wafer transfer chamber is 2400 liters, the oxygen concentration of the wafer storage chamber of the pod is X (ppm), the oxygen volume of the wafer storage chamber of the pod is Xv (liters), the oxygen concentration of the pod opener chamber and the wafer transfer chamber is Y (ppm), the oxygen volume of the pod opener chamber and the wafer transfer chamber is Yv (liters), the oxygen concentration of the wafer storage chamber of the pod, the pod opener chamber and the wafer transfer chamber is Z (ppm).

The following formulas (1) and (2) are established when the pod is closed.

$$Yv/2400 \times 10^6 = Y \quad (1)$$

$$Xv/20 \times 10^6 = X \quad (2)$$

The following formula (3) is established when the pod is open.

$$(Xv+Yv)/(20+2400) \times 10^6 = Z \quad (3)$$

Assuming that Y is made equal to 3.5, then Yv=0.0084 is obtained from formula (1).

Z=70 ppm or less, so setting Z=70, and finding Xv from formula (3) allows finding the maximum Xv when the pod is open.

Xv=0.161

By applying formula (2) we obtain:

X=8050 ppm.

Therefore, if the oxygen concentration of the wafer storage chamber of the pod is 8050 ppm or below, then the closure can open the cover unit of the pod.

According to FIG. 11, reaching an oxygen concentration of 8050 ppm or below requires approximately 1 minute.

A drop in the batch type CVD apparatus throughput can therefore be prevented, and the oxygen concentration of the wafer transfer chamber maintained at 70 ppm or below, by setting the closure to open the cover unit 10a of the pod, after a gas purge of one minute.

Figure 12:
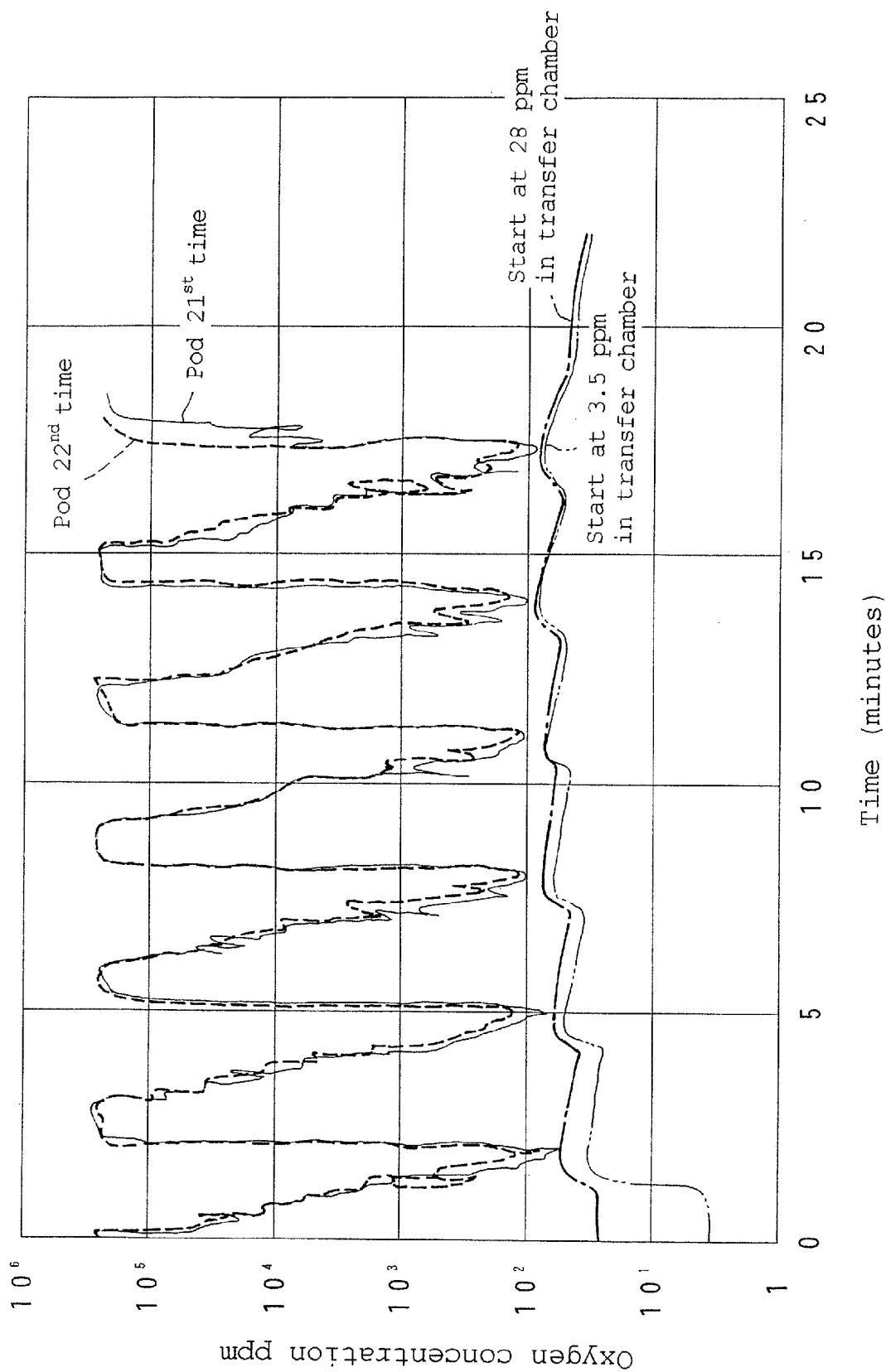
FIG. 12 is a graph showing changes in the oxygen concentration when consecutively opening and closing six pods.

FIG. 12 is a graph showing the change in oxygen concentration when the open/close operation was consecutively performed with six pods.

In FIG. 12, the vertical axis expresses the oxygen concentration (ppm) on a logarithmic scale, and the horizontal axis expresses the time in "minutes".

The pod was opened and closed six consecutive times by temporarily setting an upper threshold of 70 ppm for the oxygen concentration in the pod opener chamber and the wafer transfer chamber, and lowering the oxygen concentration in advance in the pod opener chamber and the wafer transfer chamber to two levels of 3.5 ppm and 28 ppm.

FIG. 12 shows that when six pods were opened, the oxygen concentration in the pod opener chamber and the wafer transfer chamber rose respectively. The 3.5 ppm level rose to 30 ppm; and the 28 ppm level rose to 500 ppm. It can be seen that the respective oxygen concentrations that had risen in the pod opener chamber and the wafer transfer chamber each lowered gradually.

This rise and fall in oxygen concentration repeats, and ultimately a 23 minute period was required to reach the target value which is an oxygen concentration of 30 ppm.

In FIG. 11, a period of 4 minutes was required to reach 30 ppm when the pod was opened at 10,000 ppm. A period of 36 minutes was required for the six pods when the pod conveyor time was included in this period.

The required time can therefore by shorted by 13 minutes compared to the conventional case where the pod was opened at 10,000 ppm in FIG. 12.

The film forming step is briefly described next.

The film forming step where the wafer transfer port 13 is essentially in standby, is performed in the process tube 4 when a pre-specified number of wafers 9 are loaded into the boat 8 from the pod 10.

Namely, the boat 8 is raised by the boat elevator 7 and loaded into the process chamber of the process tube 4 (boat loading). When the boat 8 reaches the upper limit, the peripheral section of the upper surface of the seal cap supporting the boat 8 closes the process tube 4 into a sealed state so that the processing chamber is sealed in an airtight state.

The processing chamber of the process tube 4 that was sealed to an air-tight state, is evacuated to a vacuum of a specified intensity by the exhaust pipe 6. The heat unit 3 then heats the processing chamber of the process tube 4 to a specified temperature and specified raw gas is supplied at a specified flow rate by way of the gas supply pipe 5. The specified film is in this way formed on the wafer 9.

After a specified amount of time then elapses, the boat elevator 7 lowers the boat 8 so that the boat 8 supporting the now processed wafers 9 is unloaded into the loading and unloading station (hereafter loading station) (boat unloading).

The wafer storing step for storing the wafers in the empty pod is described next.

The wafer transfer device 15 picks up the processed wafers 9 from the boat 8 that was carried into the loading station. The processed wafers are stored in the empty pod 10 that was previously carried into the upper level port A and whose cover unit 10a was removed.

After the specified number of wafers 9 are stored into the empty pod 10 at the upper level port A, the cover unit 10a that was retracted while held by the closure 40, is returned by the first mover block 31 to the wafer loading/unloading opening 22 position, and inserted into the wafer loading/unloading opening 22 by the second mover block 31 and then inserted into the wafer loading/unloading opening 10b of the pod 10.

In this case also, the nitrogen gas 69 flows via the intake pipe 67 and the exhaust pipe 63 into the pod opener chamber 61 to purge the pod opener chamber 61 and the wafer storage chamber 10c of the pod 10, and the wafer storage chamber 10c is filled with nitrogen gas 69. In other words, the nitrogen gas 69 is supplied while the pod opener chamber 61 is in a sealed state by the closure 40 and the pod 10, the same as in the above described wafer removal step.

When the cover unit 10a is inserted into the wafer loading/unloading opening 10b, the air cylinder device 45 swivels the release shaft 41 to lock the cover unit 10a latch. The nitrogen gas 69 is in this way sealed inside the wafer storage chamber 10c.

When locking of the cover unit 10a is completed, the vacuum hold of the cover unit 10a by the suction piece 46 is released by turning off the negative pressure supplied from the intake/exhaust path to the suction port member 47 to release to the atmospheric air.

Next, the air cylinder device 26 moves the mount block 27 away from the base 21, and the end surface on the open side of the pod 10 is separated from the front surface of the base 21.

The pod 10 storing the processed wafers 9 is conveyed by the pod transfer device 14 to the pod rack 12.

The above task is mutually repeated in the upper level port A and lower level port B until all of the processed wafers 9 are discharged from the boat 8.

The wafer storage step is now complete.

However, in the wafer storage step for the processed wafers 9 stored in the wafer storage chamber 10c of the pod 10, the oxygen concentration in the wafer storage chamber 10c is lower than the oxygen concentration of the atmospheric air because the nitrogen gas 69 is sealed inside the wafer storage chamber 10c of the empty pod 10 in the wafer removal step as previously described.

Even though the wafer storage chamber 10c of the pod 10 is not fully air-tight and there is a tendency to return to the air state during the heat treatment time over a few dozen minutes to several hours, the oxygen concentration in the wafer storage chamber 10c is lower than the oxygen concentration in the atmospheric air.

Moreover, there is no problem with particle swirling around even if the nitrogen gas 69 blow rate is set to a large figure since there are no wafers 9 in the wafer storage chamber 10c of the empty pod 10.

There are no wafers 9 in the wafer storage chamber 10c of the empty pod 10. Therefore, the nitrogen gas 69 can be easily supplied compared to when the wafers 9 are present since the gas might not accumulate in some locations.

The nitrogen gas 69 can be set to a larger flow rate in the initial part of the wafer storage step, than the nitrogen gas 69 gas flow in the wafer removal step. The nitrogen gas purge time in the wafer storage step can therefore be shortened so that the overall process time can also be shortened.

The pod 10 storing the processed wafers 9 and returned to the pod rack 12, is conveyed by the pod transfer device 14 from the pod rack 12 to the pod stage 11.

The pod 10 transferred to the pod stage 11 is conveyed from the pod loading/unloading opening to outside the case 2, and is conveyed to subsequent processes such as the cleaning process and film inspection process.

The pod 10 storing new wafers 9 is then conveyed from the pod loading/unloading opening to the pod stage 11 inside the case 2.

The loading and unloading (pod loading and pod unloading) task into the pod stage 11 of old/new pods 10 as well as the pod replacement task between the pod stage 11 and pod rack 12 can proceed simultaneously with the loading and unloading task of the boat 8 into the process tube 4 (boat loading and boat unloading) as well as the periods during the film forming process namely the film-forming standby steps. Therefore, delays in the overall task time for the batch type CVD apparatus 1 can be prevented.

The film forming process for the IC production method proceeds by repeating the above described wafer loading/removing method and film forming method in the batch type CVD apparatus 1 to form the CVD film on the wafers 9.

The above embodiment renders the following effects.

(1) The opener case 60 is installed on the base 21 of the pod opener 20 to cover the wafer loading/unloading opening 10b of the pod 10. The intake pipe 67 and the exhaust pipe 63 are connected to this opener case 60 so that nitrogen gas 69 flows in the pod opener chamber 61. Therefore, when the pod 10 is opened by the pod opener 20, nitrogen gas 69 can be filled in the pod opener chamber 61 so that not only is atmospheric air sealed in the wafer storage chamber 10c of the pod 10 evacuated by the nitrogen gas 69, but also the air and moisture within the atmosphere is purged from the pod opener chamber 61 and the wafer storage chamber 10c of the pod 10 by the nitrogen gas 69.

(2) Purging the pod opener chamber 61 and the wafer storage chamber 10c of the pod 10 with nitrogen gas 69 also prevents air and moisture in the atmosphere trapped within the wafer storage chamber 10c of the pod 10 from discharging into the wafer transfer chamber 16, and therefore adverse effects such as a rise in oxygen concentration or contamination of the wafer transfer chamber 16 can be prevented.

(3) Filling nitrogen gas 69 into the wafer storage chamber 10c of the pod 10 and sealing it while the wafer loading/unloading opening 10b of the pod 10 is closed, serves to suppress natural oxidation on the wafers that are stored.

(4) Installing an exhaust quantity adjuster means in the exhaust pipe 63 controls the exhaust pressure so that the pressure $P_1$ of the device chamber 18 is lower than the pressure $P_2$ of the pod opener chamber 61 that is lower than the pressure $P_3$ of the wafer transfer chamber 16, and therefore the intrusion of contaminant substances as well as oxygen and moisture from the wafer storage chamber 10c of the pod 10 into the wafer transfer chamber 16 can be securely prevented.

(5) Constituting the exhaust quantity adjuster means using the open/close valve 65 and the bypass line 66 simplifies the structure and control so that a rise in costs can be prevented.

(6) The nitrogen gas purge time in the wafer storage step can be shortened by setting the gas flow of nitrogen gas 69 in the wafer storage step to a larger flow than in the wafer removal step so that the overall process time can be shortened.

(7) In the initial stage of the wafer storage step, there are no wafers 9 in the wafer storage chamber 10c of the empty pod 10 so that there is no worry of particles swirling up, moreover since there are no wafers 9 in the wafer storage chamber 10c of the empty pod 10, there are few points for nitrogen gas to accumulate compared to when there are wafers present so that particle and wafer damage can be avoided even when the blow rate of nitrogen gas 69 is set to a large blow rate in the wafer storage step.

Figure 13:
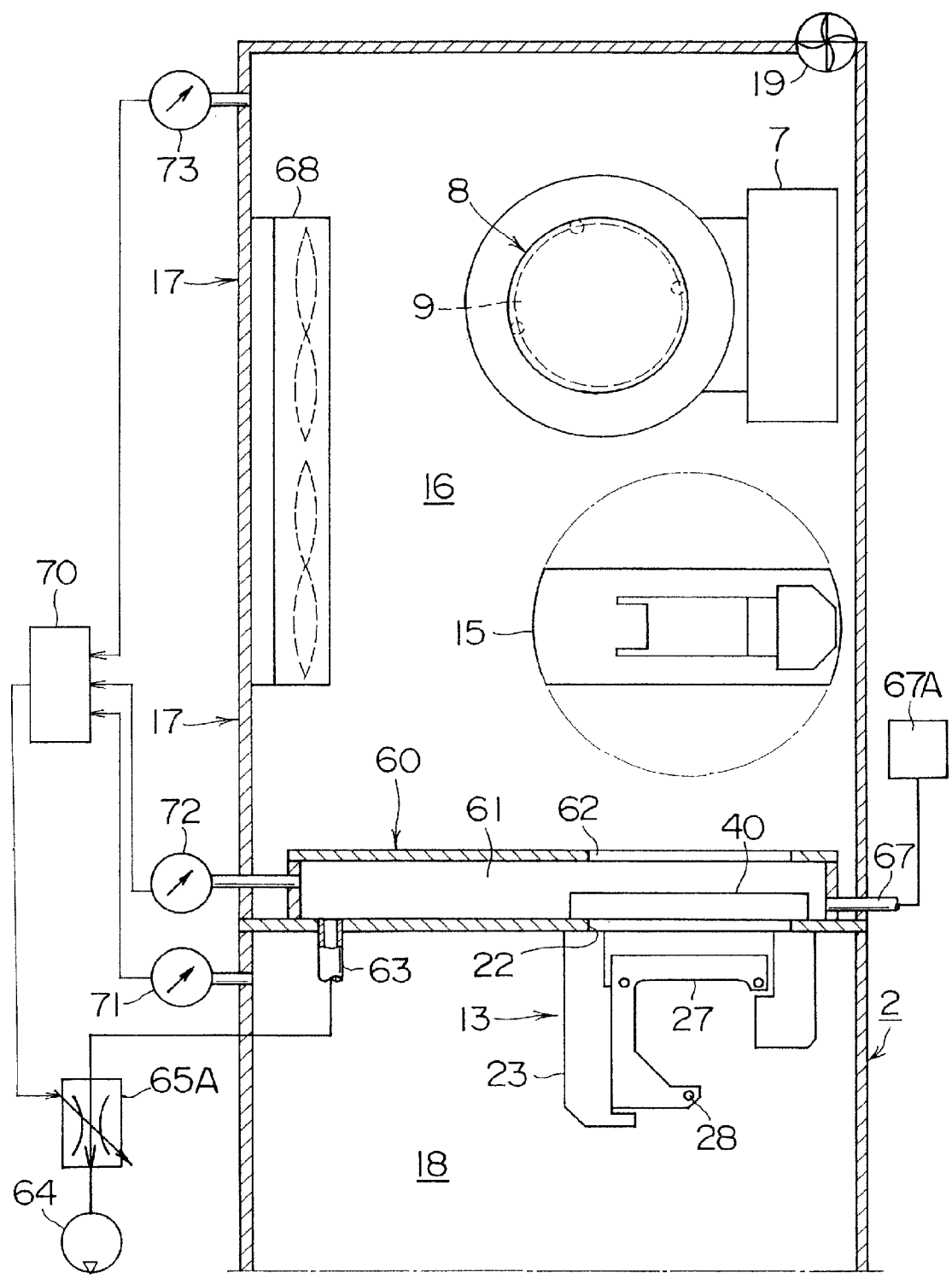
FIG. 13 is a partially abbreviated plan cross sectional view showing the batch type CVD apparatus of another embodiment of this invention.

FIG. 13 is a partially abbreviated plan cross sectional view showing the batch type CVD apparatus of another embodiment of this invention.

The point in this embodiment that differs from the previous embodiment is that a variable flow rate control valve 65A is utilized as the exhaust quantity adjuster means controlled by the controller 70.

In this embodiment also, the pressure is controlled by the variable flow rate control valve 65A so that the pressure $P_1$ of the device chamber 18 is lower than the pressure $P_2$ of the pod opener chamber 61 that is lower than the pressure $P_3$ of the wafer transfer chamber 16 so that the intrusion of contaminant substances as well as oxygen and moisture from the wafer storage chamber 10c of the pod 10 into the wafer transfer chamber 16 can be securely prevented.

The present invention is not limited by the above described embodiments and may include changes or adaptations of all types that do not depart from the spirit or the scope of the invention.

The inert gas is not limited to nitrogen gas. Other inert gases such as helium, argon, krypton and xenon gases may also be used.

The pod utilized as the carrier is not limited to structures where multiple wafers are stored directly and may include structures for storing cassettes holding stacks of multiple wafers.

The batch type CVD apparatus is not limited to use in film forming processes and may be utilized in other thermal treatment processes such as oxidation film forming processes and diffusion processing.

The above embodiments described cases using batch vertical diffusion CVD apparatus, however, the present invention is not limited to this and may also apply to general semiconductor manufacturing apparatus such as oxidation apparatus, diffusion apparatus, annealing apparatus and other thermal treatment apparatus (furnace).

What is claimed is:

1. A semiconductor device manufacturing method using a semiconductor manufacturing apparatus comprising a carrier in which a freely mountable/removable cover unit is provided on a substrate loading/unloading opening and a substrate is stored through the substrate loading/unloading opening, and a carrier open/close chamber in communication with the carrier, and a substrate transfer chamber in communication with the carrier open/close chamber, and a substrate processing chamber in communication with the substrate transfer chamber, and an exhaust unit for exhausting the atmosphere within the carrier open/close chamber by suction, and an exhaust quantity adjuster unit for regulating the suction exhaust quantity of the exhaust unit, and an inert gas supply unit for supplying inert gas to the carrier open/close chamber, and a controller for regulating the exhaust quantity of the exhaust quantity adjuster unit, and comprising:

a substrate removing step of removing the cover unit from the substrate loading/unloading opening of the carrier in the carrier open/close chamber where inert gas is supplied, and removing the substrate from a substrate storage chamber of the carrier through the substrate loading/unloading opening of the carrier, a substrate processing step of processing the substrate in the substrate processing chamber, and a substrate storing step of supplying inert gas to the carrier open/close chamber at a larger flow rate than the supply flow rate of the inert gas supplied to the carrier open/close chamber at the substrate removing step, and storing the substrate processed at the substrate processing step to the substrate storage chamber of the carrier through the substrate loading/unloading opening of the carrier.

2. A semiconductor device manufacturing method according to claim 1, comprising the step of regulating the exhaust quantity adjuster unit so that when supplying inert gas from the inert gas supply unit to the carrier open/close chamber, the quantity of exhaust from the inert gas supply unit becomes larger than the quantity of exhaust when inert gas is not being supplied.

3. A semiconductor device manufacturing method according to claim 1, comprising the step of regulating the exhaust quantity of the exhaust quantity adjuster unit so that a pressure P1 outside the carrier open/close chamber is lower than a pressure P2 inside the carrier open/close chamber, and moreover that the pressure P2 inside the carrier open/close chamber is lower than a pressure P3 of the substrate transfer chamber when the opening of the substrate transfer chamber connecting the carrier open/close chamber is closed.

4. A semiconductor device manufacturing method according to claim 1, comprising the step of regulating the exhaust quantity of the exhaust quantity adjuster unit so that the atmosphere within the apparatus flows from the transfer chamber to the carrier open/close chamber, and further from the carrier open/close chamber to outside the apparatus.

5. A semiconductor device manufacturing method according claim 1, comprising the step of regulating the exhaust quantity of the exhaust quantity adjuster unit so that a pressure P1 outside the carrier open/close chamber is lower than a pressure P2 inside the carrier open/close chamber, and moreover that the pressure P2 inside the carrier open/close chamber is lower than a pressure P3 of the substrate transfer chamber when the substrate loading/unloading opening of the carrier with removable cover unit is open, and the opening of the substrate transfer chamber connecting the carrier open/close chamber is closed.

6. A semiconductor device manufacturing method according to claim 1, comprising the step of regulating the exhaust quantity of the exhaust quantity adjuster unit so that a pressure P1 outside the carrier open/close chamber is lower than a pressure P2 inside the carrier open/close chamber, and moreover that the pressure P2 inside the carrier open/close chamber is lower than a pressure P3 of the substrate transfer chamber when the substrate loading/unloading opening of the carrier with removable cover unit is open, the cover unit is retracted into a cover unit retraction chamber formed in the carrier open/close chamber, and a substrate transfer space is formed to allow passage of the substrate between the carrier open/close chamber and the substrate transfer chamber; and moreover the exhaust unit allows gas flow from the substrate transfer space via the cover unit retraction chamber to the exhaust unit.

7. A semiconductor device manufacturing method according to claim 1, comprising the step of regulating the exhaust quantity of the exhaust quantity adjuster unit so that the atmosphere within the apparatus flows from the transfer chamber to the carrier open/close chamber, and further from the carrier open/close chamber to outside the apparatus when the substrate loading/unloading opening of the carrier with removable cover unit is open, the cover unit is retracted into a cover unit retraction chamber formed in the carrier open/close chamber, and a substrate transfer space is formed to allow passage of the substrate between the carrier open/close chamber and the substrate transfer chamber; and moreover the exhaust unit allows gas flow from the substrate transfer space via the cover unit retraction chamber to the exhaust unit.

8. A semiconductor device manufacturing method according to claim 1, wherein
the substrate removing step or the substrate storing step controls the flow of inert gas and the exhaust flow of the exhaust unit, before removing the cover unit of the carrier.

9. A semiconductor device manufacturing method using a semiconductor manufacturing apparatus comprising a carrier in which a freely mountable/removable cover unit is provided on a substrate loading/unloading opening and a substrate is stored into a substrate storage chamber through the substrate loading/unloading opening, and a carrier open/close chamber in communication with the carrier, and a substrate transfer chamber in communication with the carrier open/close chamber, and a substrate processing chamber in communication with the substrate transfer chamber, and an exhaust unit for exhausting the atmosphere within the carrier open/close chamber by suction, and an exhaust quantity adjuster unit for regulating the suction exhaust quantity of the exhaust unit, and comprising: a first step for removing the substrate from the substrate storage chamber of the carrier storing the substrate, where the cover unit is moved away from the substrate loading/unloading opening, the substrate loading/unloading opening opens, inert gas flows while the carrier open/close chamber is in a sealed state, and inert gas is supplied to the substrate storage chamber, and a second step for storing the substrate in the empty carrier, where the cover unit is moved away from the substrate loading/unloading opening before the substrate is stored in the empty carrier, the substrate loading/unloading opening opens, inert gas flows while the carrier open/close chamber is in a sealed state, and inert gas is supplied to the substrate storage chamber, wherein
the inert gas flow rate per unit of time in the second step is set to a larger flow rate than the inert gas flow rate per unit of time in the first step.

* * * * *